(12) United States Patent
Poddar et al.

(10) Patent No.: US 9,608,564 B2
(45) Date of Patent: Mar. 28, 2017

(54) METAMATERIAL RESONATOR BASED DEVICE

(71) Applicant: Synergy Microwave Corporation, Paterson, NJ (US)

(72) Inventors: Ajay Kumar Poddar, Elmwood Park, NJ (US); Ulrich L. Rohde, Upper Saddle River, NJ (US)

(73) Assignee: Synergy Microwave Corporation, Paterson, NJ (US)

( * ) Notice: Subject to any disclaimer, the term of this patent is extended or adjusted under 35 U.S.C. 154(b) by 0 days.

(21) Appl. No.: 14/680,826

(22) Filed: Apr. 7, 2015

(65) Prior Publication Data
US 2015/0303870 A1    Oct. 22, 2015

Related U.S. Application Data

(60) Provisional application No. 61/976,185, filed on Apr. 7, 2014.

(51) Int. Cl.
| | |
|---|---|
| *H03B 1/02* | (2006.01) |
| *H01P 7/06* | (2006.01) |
| *H01P 7/08* | (2006.01) |
| *H03H 9/24* | (2006.01) |
| *H03B 5/18* | (2006.01) |
| *H01P 5/02* | (2006.01) |

(52) U.S. Cl.
CPC ............... *H03B 1/02* (2013.01); *H01P 5/028* (2013.01); *H01P 7/065* (2013.01); *H01P 7/082* (2013.01); *H01P 7/088* (2013.01); *H03B 5/1847* (2013.01); *H03H 9/24* (2013.01)

(58) Field of Classification Search
CPC ....... H03H 9/24; H03H 9/2431; H03H 9/2426
USPC .................................. 331/96, 107 SL, 116 M
See application file for complete search history.

(56) References Cited

U.S. PATENT DOCUMENTS

| | | | | |
|---|---|---|---|---|
| 2007/0052498 A1* | 3/2007 | Pan | ...................... | H03H 3/0077 333/186 |
| 2012/0223142 A1* | 9/2012 | Wang | ................... | H01Q 1/2216 235/462.25 |
| 2013/0154751 A1* | 6/2013 | Sim | .......................... | H03B 7/00 331/115 |

FOREIGN PATENT DOCUMENTS

| | | |
|---|---|---|
| EP | 1217685 A2 | 6/2002 |
| EP | 1458050 A1 | 9/2004 |
| WO | 0197320 A2 | 12/2001 |

OTHER PUBLICATIONS

Poddar Ajay K et al: "A novel evanescent-mode Möbius-coupled resonator oscillators", 2013 Joint European Frequency and Time Forum & International Frequency Control Symposium (EFTF/IFC), IEEE, Jul. 21, 2013 (Jul. 21, 2013), pp. 944-947, XP032540613, DOI: 10.1109/EFTF-IFC.2013.6702077 [retrieved on Jan. 2, 2014] paragraph [011.]; figures 3-5.

(Continued)

*Primary Examiner* — Jeffrey Shin
(74) *Attorney, Agent, or Firm* — Lerner, David, Littenberg, Krumholz & Mentlik, LLP

(57) ABSTRACT

The present disclosure is directed a metamaterial circuit may further be coupled to a möbius strip resonator or a substrate integrated waveguide. The disclosure is also directed to a device having a tuning circuit and a metamaterial resonator operatively coupled to the tuning circuit. The metamaterial resonator operatively coupled to the tuning circuit may likewise be coupled to a möbius strip resonator or a substrate integrated waveguide.

33 Claims, 26 Drawing Sheets

(56) References Cited

OTHER PUBLICATIONS

Cheol Gyu Hwang et al: "Novel methods for phase noise reduction and harmonic suppression in a planar oscillator circuit based on split ring resonators", Microwave Conference, 2006. APMC 2006. Asia-Pacific, IEEE, PI, Dec. 1, 2006 (Dec. 12, 2006), pp. 519-622, XP031201557, DOI: 10.1109/APMC.2006.4429497, ISBN: 978-4-902339-08-6.

Rohde U L et al: "Evanescent-mode metamaterial resonator based signal sources", IEEE MTT-S International Microwave and RF Conference, IEEE, Dec. 14, 2013 (Dec. 14, 2013), pp. 1-5, XP032580910, DOI: 10.1109/IMARC.2013.6777715 [retrieved on Mar. 24, 2014] paragraph [III.]; figures 2-5.

R. Ghatak et al: "Moore Curve Fractal-Shaped Miniaturized Complementary Spiral Resonator," Microwave and Optical Technology Letters, Aug. 1, 2013 (Aug. 1, 2013), pp. 1950-1954, XP055215821, DOI: 10.1002/mop27682, Retrieved from the Internet: URL:http:jjonlinelibrary.wiley.com/doi/10.1002(mop.27682/pdf.

Pu Wang et al: "A novel Ka-band folded dual-mode band-pass filter with LTCC technology", Microwave and Millimeter Wave Technology (ICMMT), 2012 International Conference on, IEEE, May 5, 2012 (May 5, 2012), pp. 1-3, XP032451896, DOI: 10.1109/ICMMT.2012.6230021, ISBN: 978-1-4673-2184-6, figure 2.

Poddar Ajay K et al: "A novel Mobius-coupled printed resonator based signal sources", IEEE—MTTS International Microwave Symposium. Digest, IEEE, US, Jun. 2, 2013 (Jun. 2, 2013), pp. 1-4, XP032546262, ISSN: 0149-645X, DOI: 10.1109/MWSYM.2013.6697691 [retrieved on Dec. 27, 2013] abstract; figure 8.

Partial International Search Report for Application No. PCT/US2015/024769 dated Oct. 8, 2015.

Chandrasekhar K et al: "Design of left-handed metamaterials using hexagonal split ring resonator at S-band frequencies", Applied Electromagnetics Conference, 2007. AEMC 2007. IEEE, IEEE, Piscataway, NJ, USA, Dec. 19, 2007 (Dec. 19, 2007), pp. 1-4, XP031344374, ISBN: 978-1-4244-1863-3, paragraph [0II.]; figure 4.

Yuandan Dong et al: "A dual-band oscillator with reconfigurable cavity-backed complementary split-ring resonator", Microwave Symposium Digest (MTT), 2012, IEEE MTT-S International, IEEE, Jun. 17, 2012 (Jun. 17, 2012), pp. 1-3, XP032216967, DOI: 10.1109/MWSYM.2012.6259451 ISBN: 978-1-4673-1085-7, paragraph [0II.]; figures 1,2,5.

Yuan Dan Dong et al: "Substrate Integrated Waveguide Loaded by Complementary Split-Ring Resonators and Its Applications to Miniaturized Waveguide Filters", IEEE Transactions on Microwave Theory and Techniques, IEEE Service Center, Piscataway, NJ, US, vol. 57, No. 9, Sep. 1, 2009 (Sep. 1, 2009), pp. 2211-2223, XP011271861, ISSN: 0018-9480, DOI: 101109/TMTT.2009.2027156, paragraph [II.A]; figures 1,2.

Turgaliev V et al: "A novel dual-bandpass microwave filter using espilon-near-zero metamaterials", 2013 7th International Congress on Advanced Electromagnetic Materials in Microwaves and Optics, IEEE, Sep. 16, 2013 (Sep. 16, 2013), pp. 136-138, XP032592009, DOI: 10.1109/METAMATERIALS.2013.6808978 [retrieved on Apr. 30, 2014] paragraph [0II.]; figure 1.

International Search Report for Appln. No. PCT/US2015/024769 dated Nov. 18, 2015.

* cited by examiner

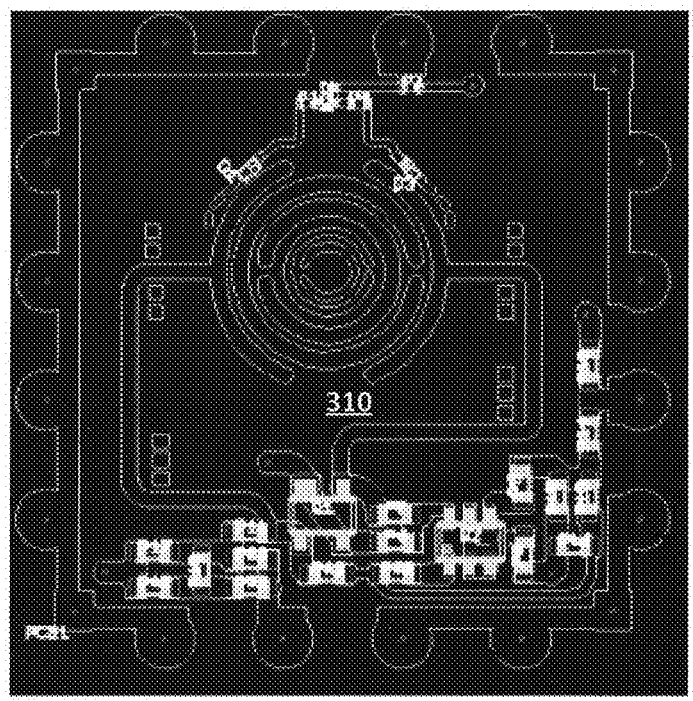
FIGURE 3A    315
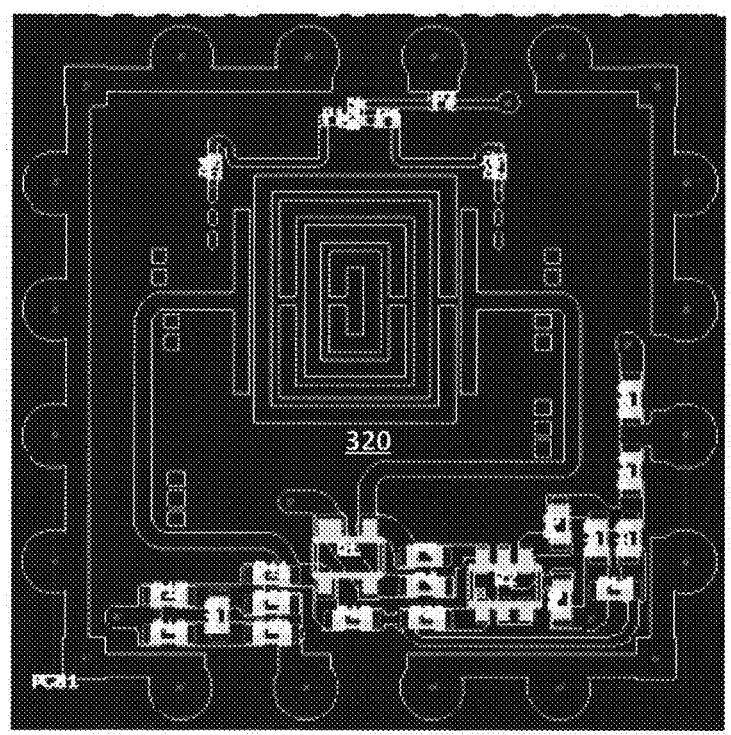
FIGURE 3B    325

METAMATERIAL RESONATOR BASED DEVICE

CROSS-REFERENCE TO RELATED APPLICATIONS

The present application claims the benefit of the filing date of U.S. Provisional Patent Application No. 61/976,185 filed Apr. 7, 2014, the disclosure of which is hereby incorporated herein by reference.

FIELD OF THE INVENTION

The present disclosure relates to metamaterial resonators, and to applications of such resonators, for example, in planar microwave transmission structures.

BACKGROUND

Metamaterials are artificial materials that are engineered to have properties that are not found in nature, and that are not necessarily possessed by their constituent parts alone. In this sense, metamaterials may be assemblies of multiple individual elements, unit cells, or a cell array, on any scale, from nano to bulk.

A metamaterial simultaneously exhibiting a relative effective permeability and a relative effective permittivity below zero over a wide bandwidth, and may include: one of a two- or three-dimensional arrangement of unit cells or a cell array, each of the unit cells having a magnetic dipole moment and an electric dipole moment that are dependent upon one or more of an incident magnetic/electric field, and a coupling mechanism for coupling the incident magnetic field and electric field to one or more devices. Optionally, the coupling mechanism includes one or more of a split ring and a pair of parallel plates coupled by one of a rod and a wire.

Some artificial composite materials exhibit simultaneous negative values of electric permittivity ($\in < 0$) and magnetic permeability ($\mu < 0$). These materials may exhibit the following properties: an artificial homogenous structure; simultaneous negative permittivity ($-\in$) and permeability ($-\mu$); the electric field, magnetic field, and wave-vector of an electromagnetic wave therein forming a left-handed triad, and having backward wave propagation, anti-parallel group and phase velocity; reversal of Snell's Law (negative index of refraction); reversal of the Doppler effect; reversal of the Vavilov-Cerenkov effect; and breaking the diffraction-limit.

The characteristics of artificial composite metamaterials can depend on any of the properties of the host material, embedded material, the volume of the fraction, the operating frequency, and/or morphology of the composite material (e.g., dimension, shape of the host structure and/or guest structure). Thus, controlling the dynamics of the morphology of the embedded structure provides one way of control over a change of the properties of the artificial composite metamaterials (e.g., permittivity, permeability, refractive index).

One key to the design of artificial metamaterial resonators is selecting a geometric shape that induces currents that form loops with a relatively uniform distribution, thereby producing a strong magnetic moment. One type of geometry used is a split-ring resonator (SRR). SRRs are sub-wavelength resonators that are able to inhibit signal propagation in a narrow band within the vicinity of their resonant frequency, provided that the magnetic field is polarized along the ring's axis. SRRs can be modeled as LC resonant tanks that can be externally driven by a magnetic field to inhibit signal propagation in a narrow band if properly oriented. The particular resonance frequency or frequencies of a given medium having an SRR may depend on a combination of factors, including (a) width of the split or "break" of the ring, (b) ring width, (c) distance between concentric rings, (d) substrate permittivity, (e) substrate thickness, and (f) orientation of the SRR. Other factors may include the number of rings (e.g., 1, 2, 4, etc.) and the number of splits or breaks in each ring (e.g., 1, 2, 4, etc.) of the SRR. Factors like the width of the split, ring width, distance between concentric rings, and number of splits or breaks in each ring typically have a direct proportion with the resonant frequencies while factors like the substrate permittivity, substrate thickness typically have an inverse proportion to the resonant frequency.

It is known that tunable metamaterial ring resonators may be formed on a thin film. However, such tunable resonators generally act as their own medium and not, e.g., as a complementary circuit on a circuit board having another device (e.g., a voltage controlled oscillator). Moreover, known SRRs are generally configured to resonate at a frequency on the order of THz due to physical limitations in the shape and size of the SRR ring structure. Accordingly, and in order to implement an SRR structure as a complementary circuit on a circuit board, it would be desirable to provide an SRR cell and/or SRR array having a structure with physical parameters for improved performance.

BRIEF SUMMARY OF THE INVENTION

One aspect of the disclosure provides for a device including an oscillating circuit and a metamaterial resonator. The oscillating or tuning circuit outputs an electric signal at a given frequency based at least in part on one of an input provided to the device and inherent noise or a nonlinearity in an active part of the circuit. The metamaterial resonator may be operatively coupled to the oscillating circuit, and may be adapted to increase the quality factor of the device at the given frequency.

In some examples, the metamaterial resonator may include first and second concentric split ring elements forming a substantially planar split ring resonator. Each concentric split ring element may be substantially annular with a break extending radially from a center of the split ring resonator through the annulus, the break of the first split ring element extending in the opposite direction as the break of the second split ring element. The resonator may also include first and second ports coupled to the split ring elements. The ports may be coplanar with and edge-coupled to the first split ring element. Alternatively, the ports may be broadside coupled to the metamaterial resonator, the first port being located along a first plane parallel to the first and second split ring elements, and the second port being located along a second plane parallel to the first and second split ring elements, with the first and second planes extending transversely away from the plane of the split ring elements in opposing directions.

In some examples, the resonator may include a first and second pairs of concentric split ring elements, each forming a substantially planar split ring resonator, and each concentric split ring element including a break extending radially outward from a point within the split ring resonator, the break of the first split ring element extending in the opposite direction as the break of the second split ring element, and each pair of elements having line symmetry with one another over an axis bisecting the resonator. The split ring pairs may be respectively coupled to first and second ports.

In some examples, the resonator may include a first pair of concentric split ring elements forming a substantially planar split ring resonator, each concentric split ring element being substantially annular with a break extending radially outward from a point within the split ring resonator, a second pair of concentric split ring elements having line symmetry with the first pair of concentric split ring elements over an axis bisecting the resonator, a first connection line coupling the inner split ring elements of the first and second pair, a second connection line coupling the outer split ring elements of the first and second pair, a first port coupled to the first connection line, and a second port coupled to the second connection line. The resonator may further include a ground plane below each of the split ring elements, and an etch-out on the ground plane.

Both the first and second split ring elements may be the same shape (e.g., circle, square, oval and rectangle). The resonator may be adapted to have at least one resonant frequency of about 20 GHz or lower, and/or phase noise of the oscillating circuit of the device may be about −135 dBc/Hz or greater at an offset of 10 MHz.

Another aspect of the disclosure provides for a resonant circuit including a möbius strip resonator having a topology in which a closed path formed by the möbius strip resonator maps onto itself and is continuous, and a metamaterial split ring resonator. The metamaterial split ring resonator may be operatively coupled to the möbius strip resonator. In some respects, a conductive strip of the möbius strip resonator may include one or more break, thus making the möbius strip resonator itself also a metamaterial split ring resonator. The resonant circuit may adapted to have at least one resonant frequency of about 8 GHz or lower In some examples, the möbius strip resonator may include a substantially planar conductive strip arranged in a spiral, the conductive strip having an inner end and an outer end, and extending two or more revolutions around a centerpoint of the spiral. The resonator may also include a first via coupled to the first end, a second via coupled to the second end, and an electrically conductive connection between the first and second vias, thereby connecting the first and second ends of the conductive strip to form a möbius strip.

In some examples, the möbius strip resonator may include first and second substantially annular conductive elements arranged on parallel first and second planes, respectively, each substantially annular conductive element having a respective first break defining respective first and second ends. The resonator may also include a first via extending transversely between the first and second plane and connecting the first end of the first substantially annular conductive element to the second end of the second substantially annular conductive element, as well as a second via extending transversely between the first and second plane and connecting the second end of the first substantially annular conductive element to the first end of the second substantially annular conductive element, thereby connecting the first and second substantially annular conductive elements to form a möbius strip. The first substantially annular conductive element may edge-coupled to a first port at a location of the first break, and to a second port at a location 180 degrees circumferentially from the first break. Or the first substantially annular conductive element may be broadside-coupled to a first port at a location 90 degrees circumferentially from the first break, and to a second port at a location −90 degrees circumferentially from the first break.

In some examples, each of the first and second substantially annular conductive elements may include a second break, each second break extending radially outward from a center point of the substantially annular conductive element and located approximately 90 degrees apart, around the circumference of the substantially annular conductive element, from the first break. The respective second breaks of the first and second substantially annular conductive elements may extend from their respective center points in opposite directions. The first substantially annular conductive element may broadside e.g., coupled to a first port at the location of the second break, and to a second port at a location 180 circumferentially from the first break and 90 degrees circumferentially from the second break.

Yet another aspect of the disclosure provides for a device including an oscillator circuit adapted to output an electric signal at a given frequency, the given frequency based at least in part on one of an input provided to the device and inherent noise or a nonlinearity in an active part of the oscillator circuit, and any of the above möbius/metamaterial resonant circuits. The resonant circuits may itself include one or more annular resonant elements at least partially overlaying the resonant circuit and adapted to suppress higher order modes generated by the device. Phase noise of the oscillator circuit of the device may be about e.g., 175 dBc/Hz or greater at an offset of 10 MHz.

Yet a further aspect of the disclosure provides for a resonant circuit having a substrate integrated waveguide including a first planar metal layer, a second planar metal layer parallel to the first layer, and a plurality of plated vias extending transversely between the first and second planar metal layers, and connecting the first and second planar metal layers to one another. The resonant circuit may further include a metamaterial resonator operatively coupled to the substrate integrated waveguide. The resonant circuit may be adapted to have at least one resonant frequency of about 25 GHz or lower.

In some examples, the metamaterial resonator may include first and second concentric split ring elements forming a substantially planar split ring resonator. Each concentric split ring element may have a break extending radially from a center of the split ring resonator. The break of the first split ring element may extend in the opposite direction as the break of the second split ring element. The split ring elements may be coupled to first and second ports. The first and second concentric ring elements may form a substantially planar complementary split ring resonator.

In some examples, the metamaterial resonator may be coupled to first and second ports and may include a single substantially circular ring having first and second breaks on opposing sides of the ring. The first and second breaks may be aligned with the first and second ports along a first axis of the resonant circuit, respectively, and each of the breaks defining broken ends of the circular ring. Each broken end of the ring may extend in parallel with the first axis and in the direction towards the first port. In other examples, the metamaterial resonator may be coupled to a single port and each broken end of the ring may extend in the direction towards the single port.

An even further aspect of the disclosure provides for a device including an oscillator circuit and one of the above resonant circuits. The device may include one or more varactor diodes coupled to the metamaterial resonator. The phase noise of the oscillator circuit of the device may be about, e.g., 115.2 dBc/Hz or greater at a 1 MHz offset.

In some of the above examples, the example metamaterial resonators may implemented as a complementary circuit on a substrate or circuit board (e.g., printed circuit board).

BRIEF DESCRIPTION OF THE DRAWINGS

Each of FIGS. 1A-1F is a perspective view of a metamaterial resonator in accordance with an aspect of the present disclosure.

Each of FIGS. 2A-2F is a graphical representation of loss characteristics for the respective metamaterial resonators of FIGS. 1A-1F.

Each of FIGS. 3A-3D is a plan view of a voltage controlled oscillator including a metamaterial resonator in accordance with an aspect of the present disclosure.

Each of FIGS. 4A-4D is a graphical representation of phase noise characteristics for the respective voltage controlled oscillators of FIGS. 3A-3D.

Each of FIGS. 5A-5E is a perspective view of a möbius resonator in accordance with an aspect of the present disclosure.

Each of FIGS. 6A-6E is a graphical representation of loss characteristics for the respective möbius resonators of FIGS. 5A-5E.

Figure 7:
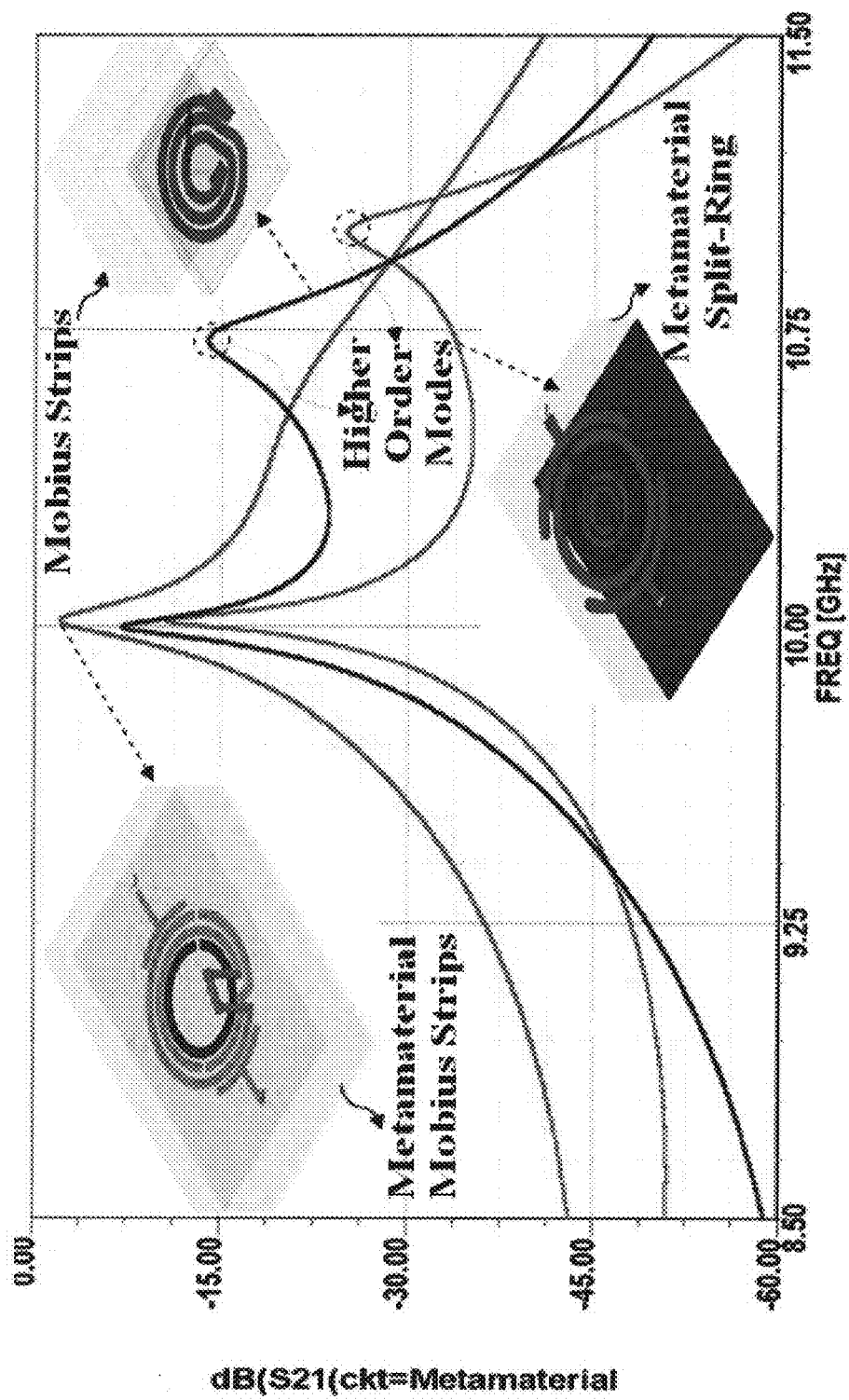

FIG. 7 is a plan view of a voltage controlled oscillator including a metamaterial-möbius resonator in accordance with an aspect of the present disclosure.

Figure 8:
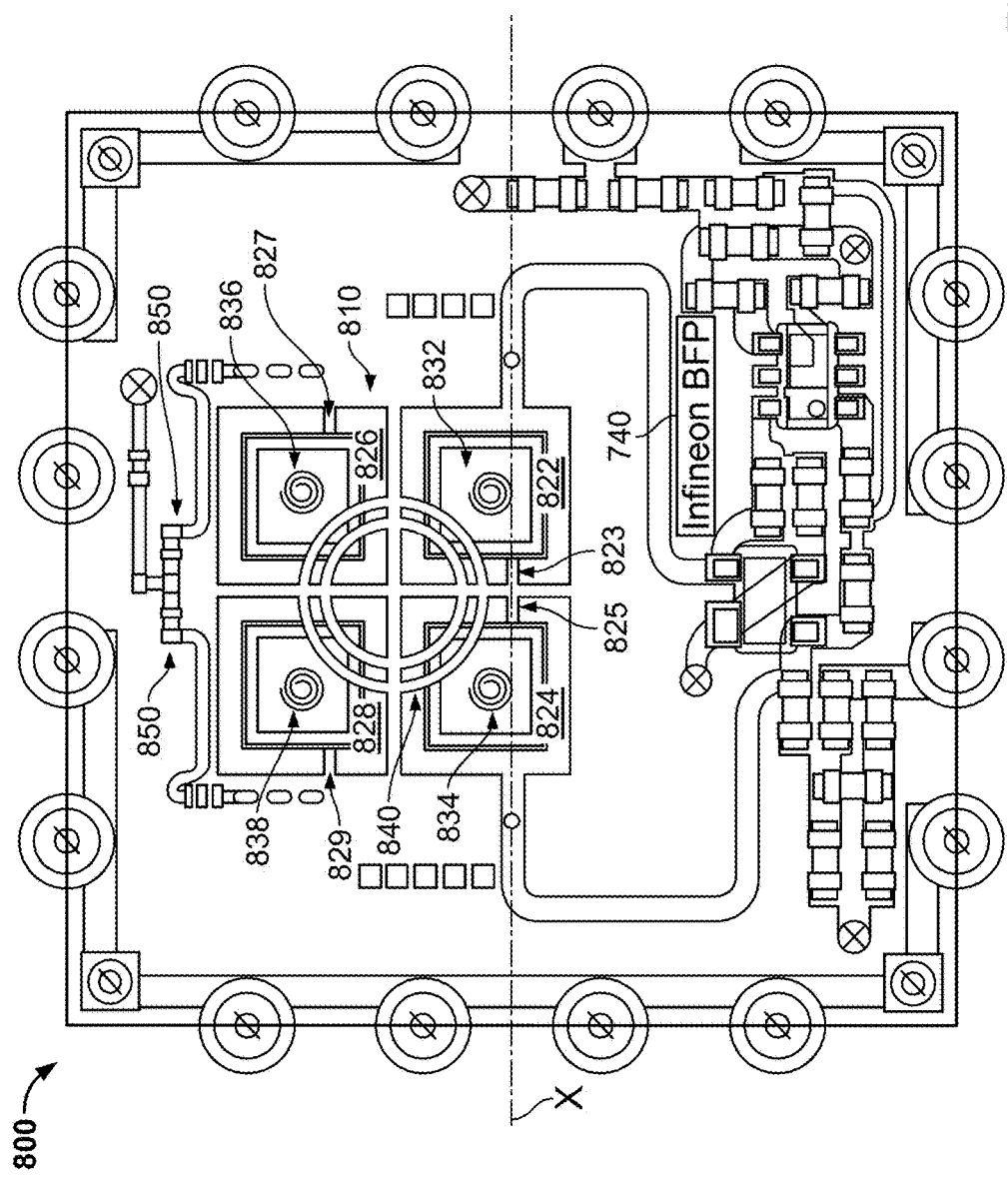

FIG. 8 is a graphical representation of phase noise characteristics for the voltage controlled oscillator of FIG. 7.

Figure 9:
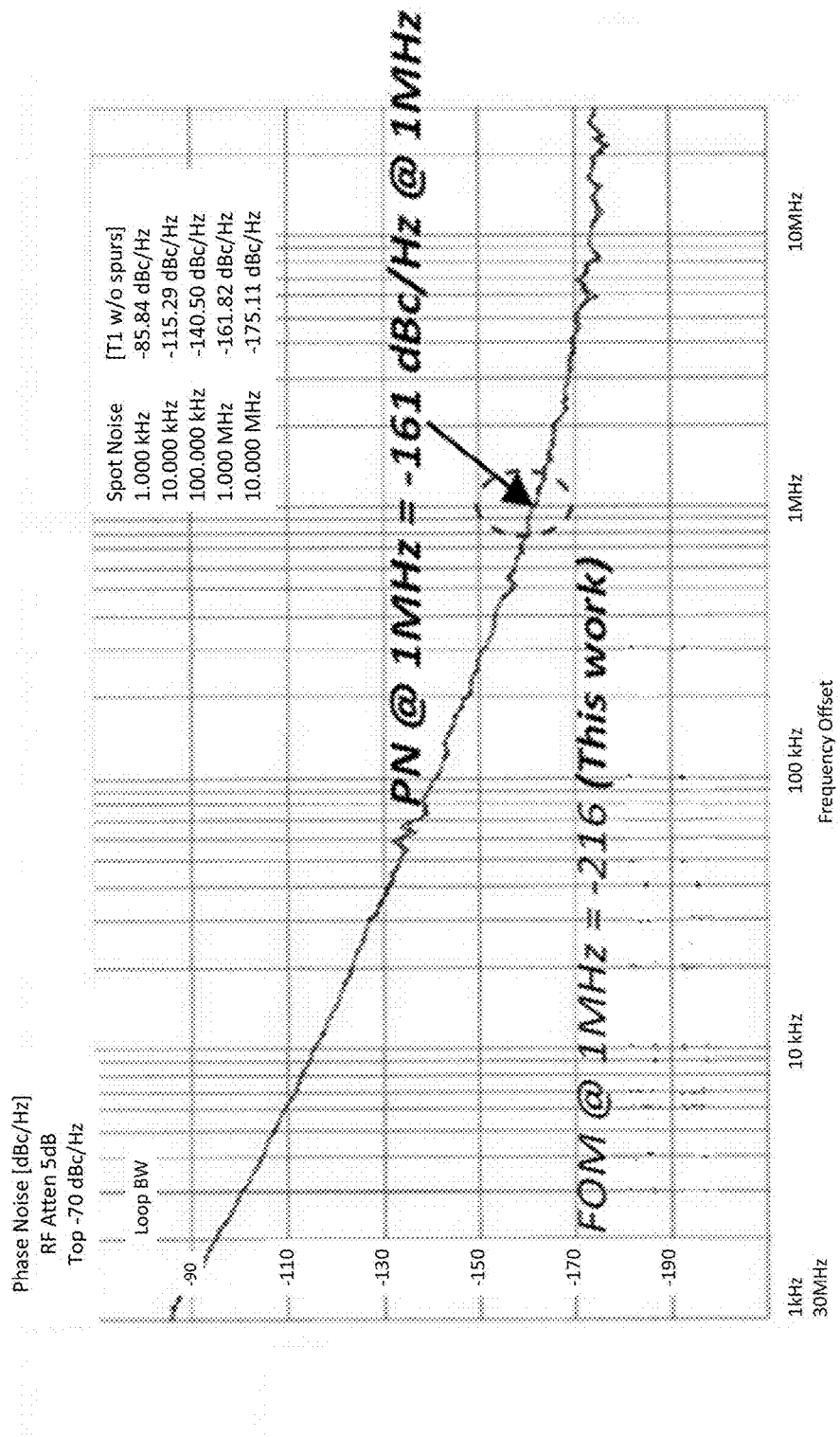

FIG. 9 is a graphical representation of loss characteristics for a metamaterial-möbius resonator, compared to each of an example metamaterial resonator and an example möbius resonator, in accordance with an aspect of the present disclosure.

Figure 10A:
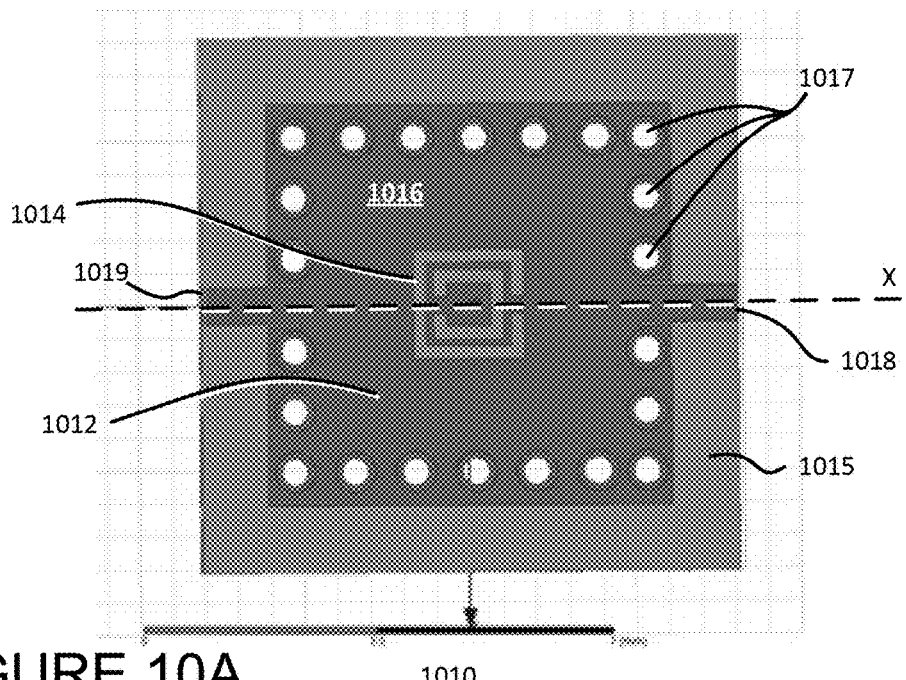
Figure 10B:
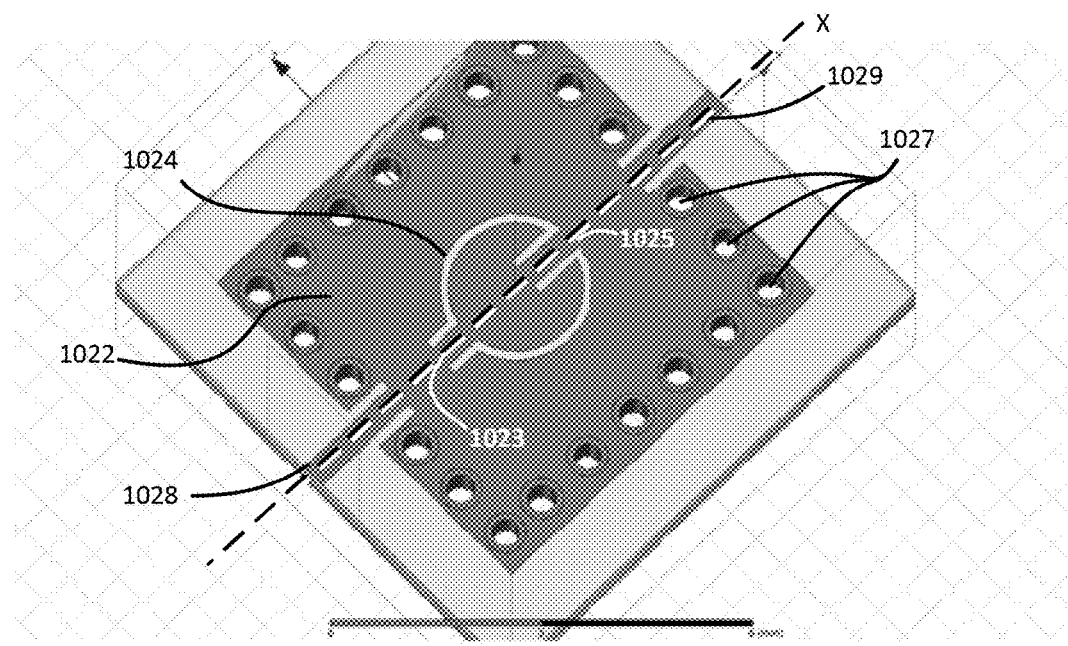
Figure 10C:
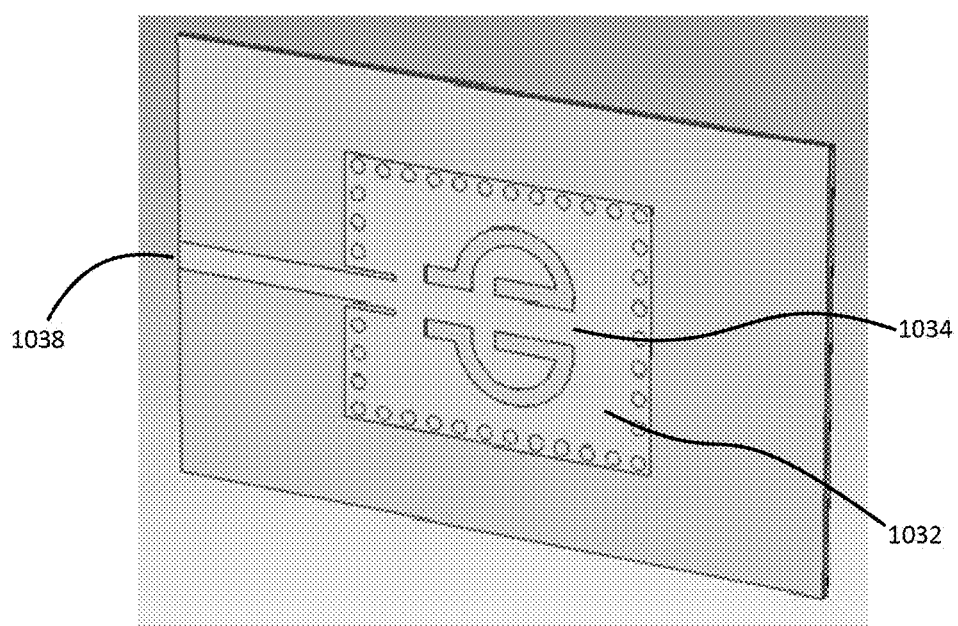

Each of FIGS. 10A-10C is a plan view of a substrate integrated waveguide including a metamaterial resonator in accordance with an aspect of the present disclosure.

Figure 11A:
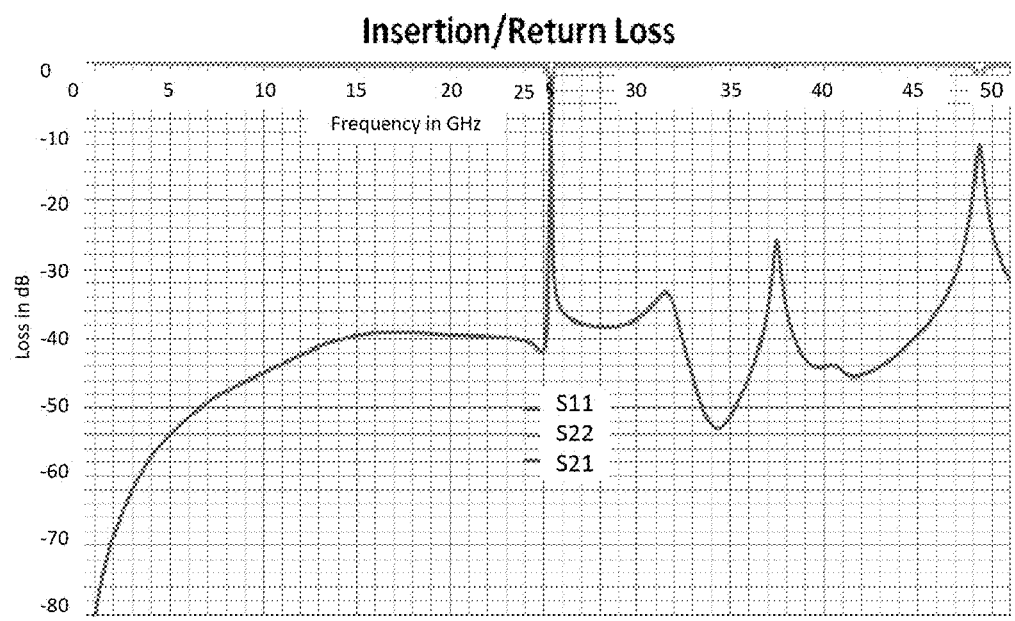
Figure 11B:
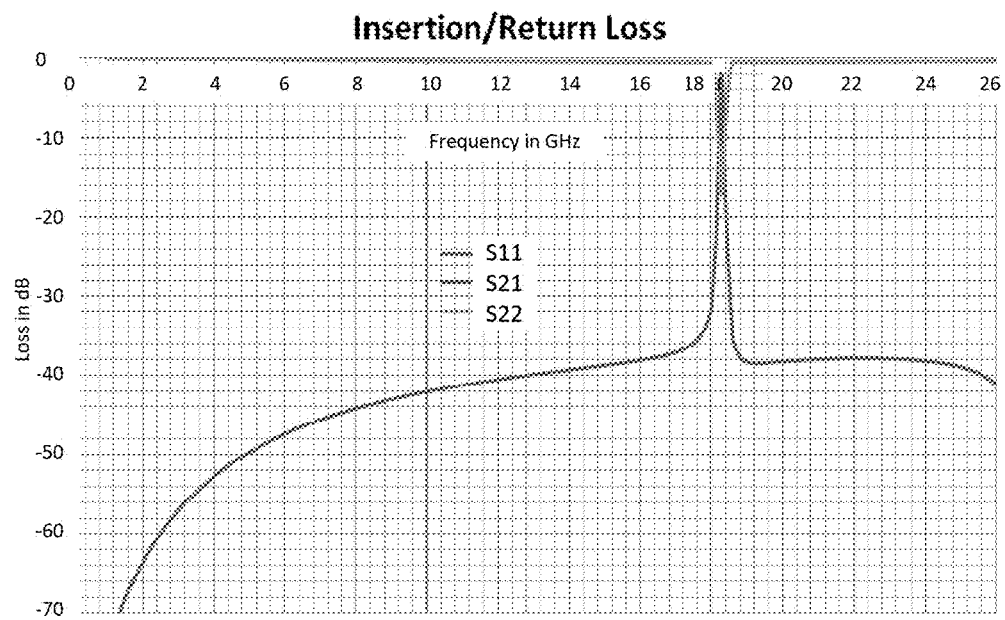

Each of FIGS. 11A-11B is a graphical representation of loss characteristics for the respective substrate integrated waveguides of FIGS. 10A-10B.

Figure 12:
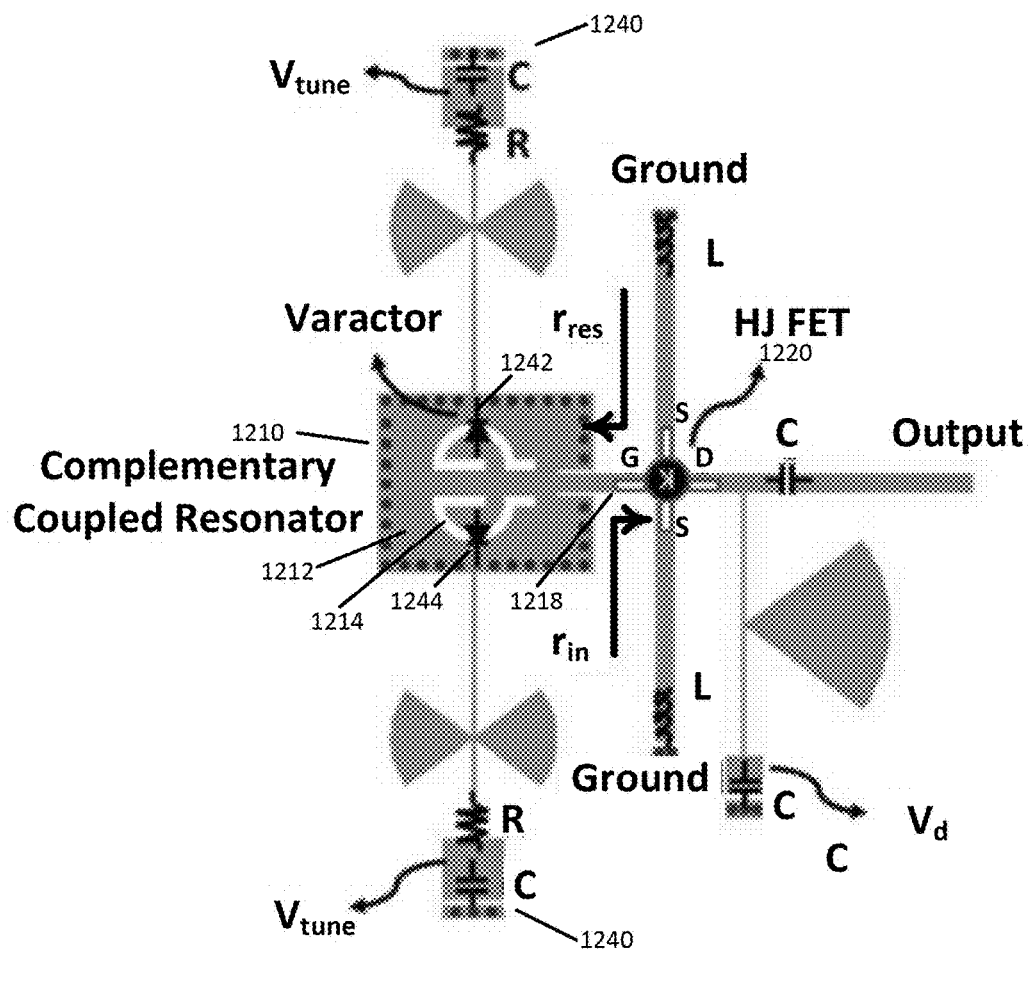
Figure 13A:
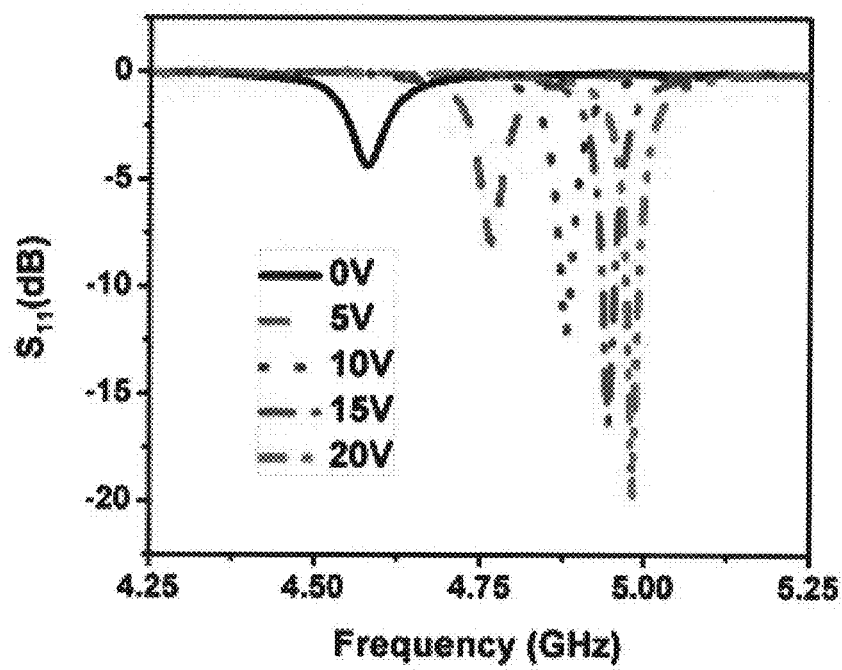

FIG. 12 is a plan view of a voltage controlled oscillator including a substrate integrated waveguide with an integrated metamaterial resonator in accordance with an aspect of the present disclosure FIG. 13A is a graphical representation of tuning and loss characteristics for the voltage controlled oscillator of FIG. 12.

Figure 13B:
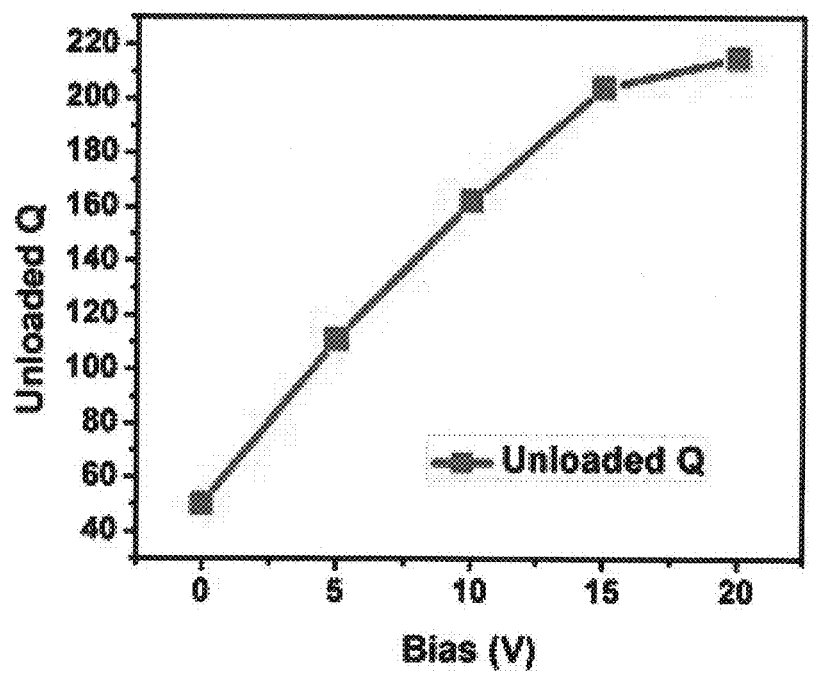

FIG. 13B is a graphical representation of quality factor characteristics for the voltage controlled oscillator of FIG. 12.

Figure 1A:
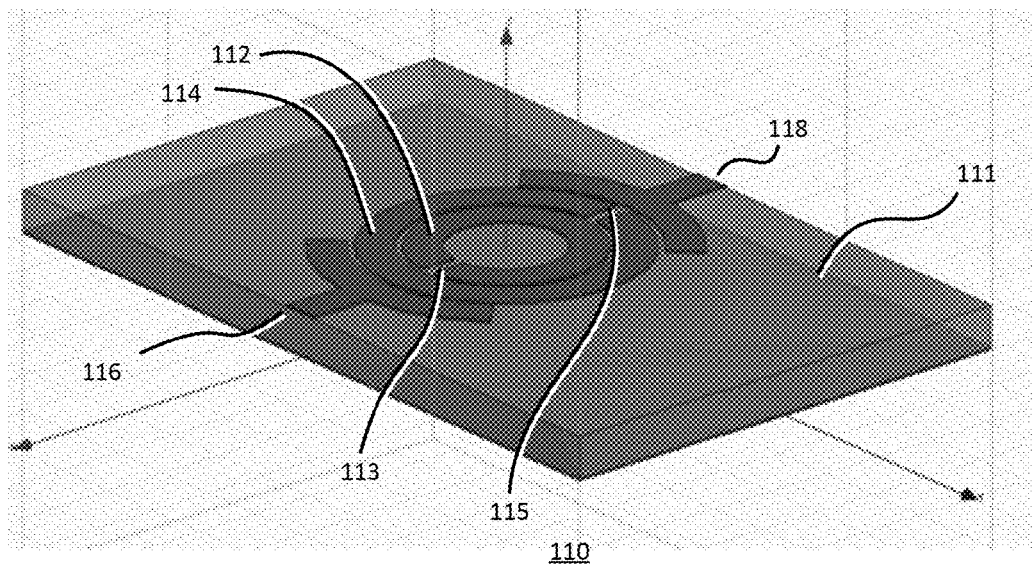
Figure 14A:
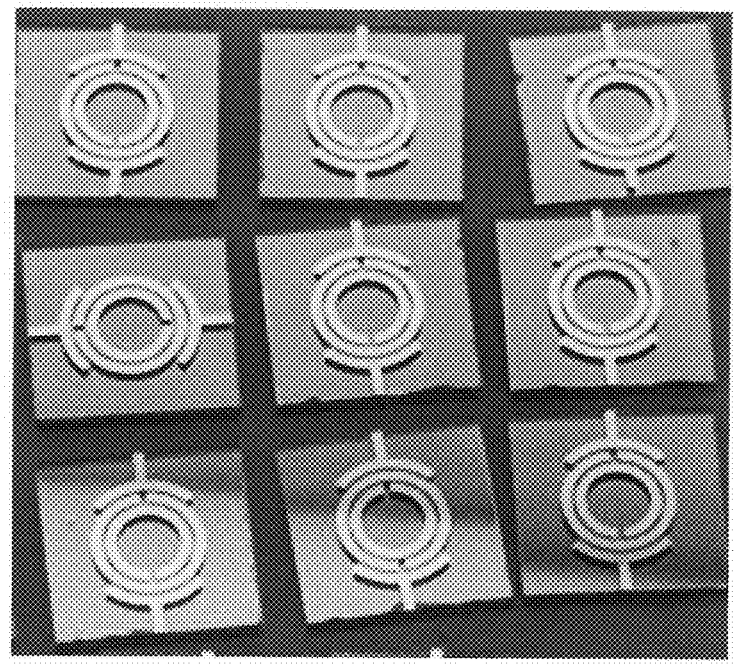

FIG. 14A is a photograph of a metamaterial resonator in accordance with FIG. 1A.

Figure 1B:
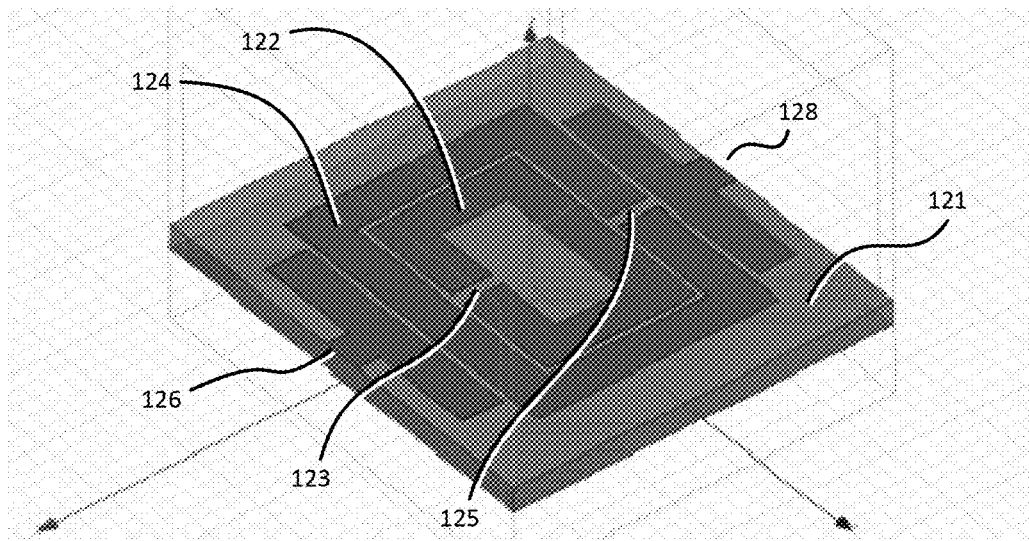
Figure 14B:
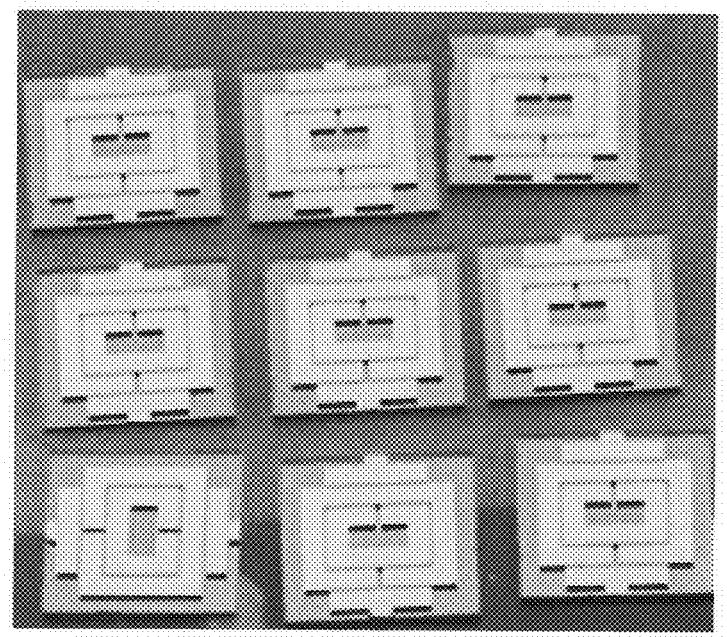

FIG. 14B is a photograph of a metamaterial resonator in accordance with FIG. 1B.

Figure 14C:
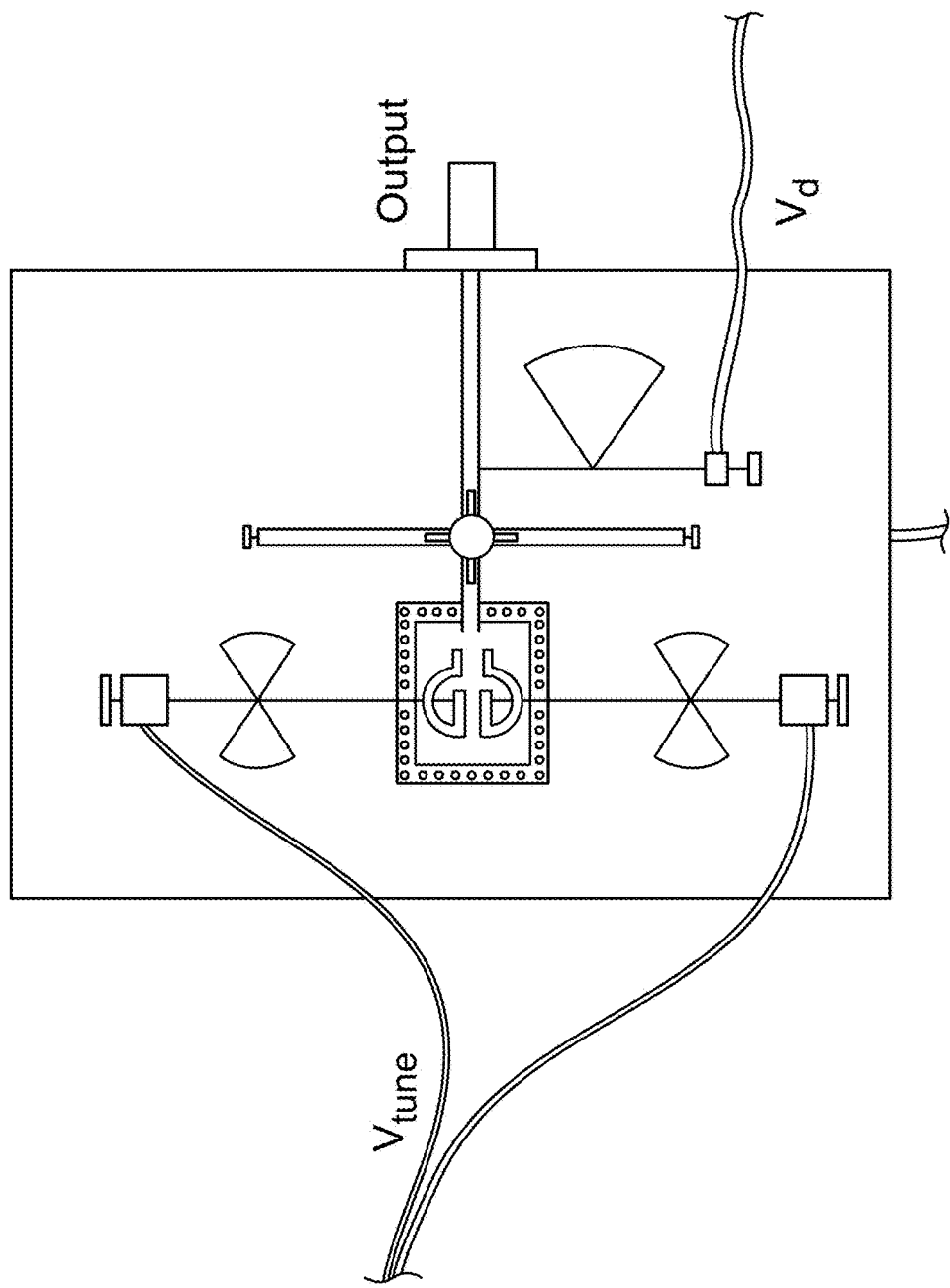

FIG. 14C is a photograph of a voltage controlled oscillator in accordance with FIG. 12.

DETAILED DESCRIPTION

The present disclosure provides for improvements to SRR and other metamaterial resonators, such as combining one or more SRRs into a resonant structure, combining one or more SRRs with a möbius strip resonator, and combining one or more SRRs with a substrate integrated waveguide. Additionally, the present disclosure provides for improvements to operation of other electronic devices, such as voltage controlled oscillators (VCOs) by incorporating one or more of the improved SRR structures into the VCO design.

Metamaterial resonators may be used in many electronic and optoelectronic devices, such as filters and oscillators, in order to reduce noise and compensate for losses by suppressing bands of unwanted frequencies. While other active devices are known to reduce noise and compensate for losses, these devices have their own limitations, such as the noise/losses they themselves introduce into the system(s) or devices that they control. By contrast, the metamaterial resonator introduces comparatively little or no noise to the system or device. The resonator can be set to a resonant state by temporary use of an active device, such as a transistor in, for example, an oscillator circuit. Once the metamaterial resonator is operating at the resonant frequency, the active device may be deactivated, leaving the metamaterial resonator on its own to compensate for losses in the system or device due to its unique properties of simultaneous negative permittivity ($-\in$) and permeability ($-\mu$) (or negative refractive index). In this respect, the present disclosure provides examples of improved VCO design. However, it is understood that the same or similar improved SRR structures may be applied to other circuits, devices and systems to provide similar improvements (e.g., reduced phase noise, reduced insertion losses, etc.).

FIG. 1A shows a first example metamaterial resonator 110 in accordance with the present disclosure. The resonator 110 is made up of a pair of split ring elements 112 and 114 formed in a substantially planar configuration on a common surface of a substrate 111 (e.g., a printed circuit board), and a pair of ports 116 and 118 (e.g., microstrip arcs) on opposing ends of the substrate 111, edge-coupled to the split ring elements 112 and 114. The first and second split ring elements 112 and 114 are concentric with one another. Each split ring element is annular, with a break 113 and 115. The breaks extend through the annulus in a direction radiating from, or otherwise called extending radially outward from, the center of the ring element. In the example of FIG. 1A, the break 113 of the first ring element 112 extends from the center of the ring elements toward the first port 116, whereas the break 115 of the second ring element 114 extends from the center of the ring elements toward the second port 118. In this respect, the break 113 of the first ring element 112 extends in the opposite direction as the break 115 of the second ring element 114. Each of the breaks 113 and 115 has a uniform width.

In the example of FIG. 1A, each of the first and second ring elements 112 and 114 is substantially circular, and each of the ports 116 and 118 is curved along an outer perimeter of the second ring element 114 such that the distance between the second ring element 114 and each port (in the direction extending radially from the center of the ring elements) is uniform. However, in other examples, the ring elements may be made in a different shape, such as square, oblong or rectangular. In those other examples, the ports may be appropriately shaped or curved to maintain a uniform distance from the second ring element.

FIG. 1B shows a second example metamaterial resonator 120 having a structure similar to that of the first example resonator 110, except that the first and second ring elements 122 and 124 are substantially annular rectangles. As in the first example resonator 110, each of the ring elements of the second example resonator 120 has a common center, and includes a break 123 and 125 extending from the common center towards a respective port 126 and 128. In the example of FIG. 1B, the breaks are formed in the longer edge of the rectangular ring elements, but in other examples may be formed in the shorter edge. The edge coupling of each of the ports 126 and 128 is formed in a substantially straight line to maintain a uniform distance from the second ring element 124. Thus, the ports are each T-shaped.

In each of the first and second example resonators 110 and 120, the resonators are edge-coupled to a pair of ports formed on a common surface of the substrate. Also, in each of those examples, the ports are formed on the same surface of the substrate as is the resonator. However, in other examples, a metamaterial resonator may be broadside coupled to ports on a layer above or below the resonator (e.g., a surface of the substrate opposite the resonator). Additionally, or alternatively, each of the ports may be formed on opposing surfaces of the substrate.

Figure 1C:
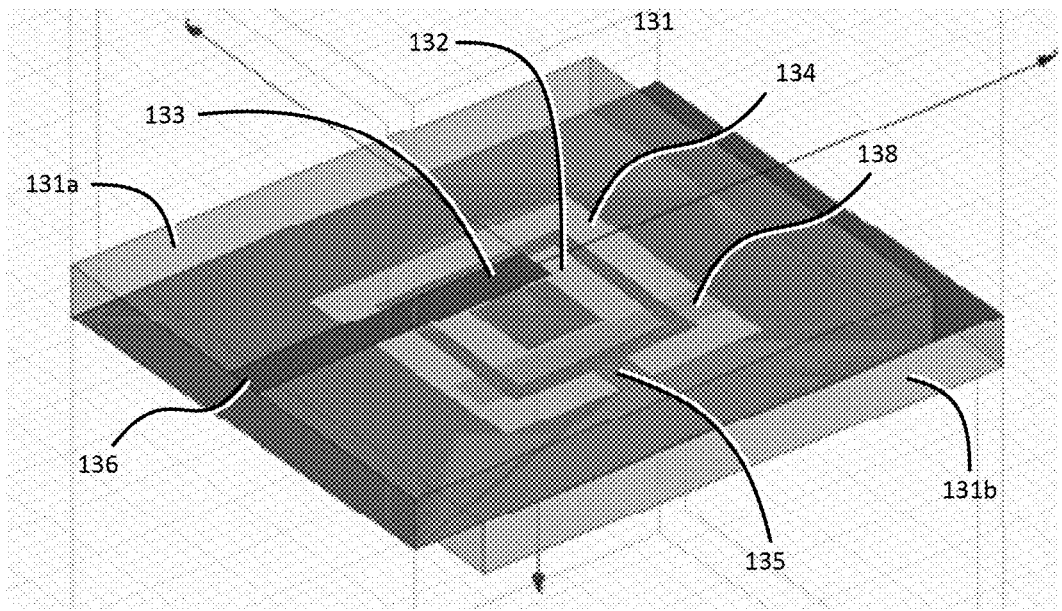

FIG. 1C shows a third example metamaterial resonator 130 having a structure similar to that of the second example resonator 120, except that the resonator 130 is a complementary of the split ring resonator discussed above and is formed in a metallization layer between two substrates 131a and 131b, and is connected to each of a first port 136 on an opposing surface of the first substrate 131a, and to a second port 138 on an opposing surface of the second substrate 131b. Each of the ports 136 and 138 is a substantially planar microstrip formed in a metallization layer on their respective substrate surfaces. The first port 136 extends from a first side of the substrate 131 (which is made up of substrates 131a and 131b) and the second port extends from an opposing second side of the substrate 131. The breaks 133/135 of the ring elements 132/134 extend radially from the common center of the ring elements in opposing directions. In the example of FIG. 1C, the breaks extend perpendicular to the directions in which the first and second ports extend, although in other examples (as in FIGS. 1A and 1B), the breaks may extend in the same direction as the ports. The metallization layer in which the resonator 130 is formed between the substrates 131a and 131b serves as a common ground plane for both of the first and second ports 136/138.

Figure 1D:
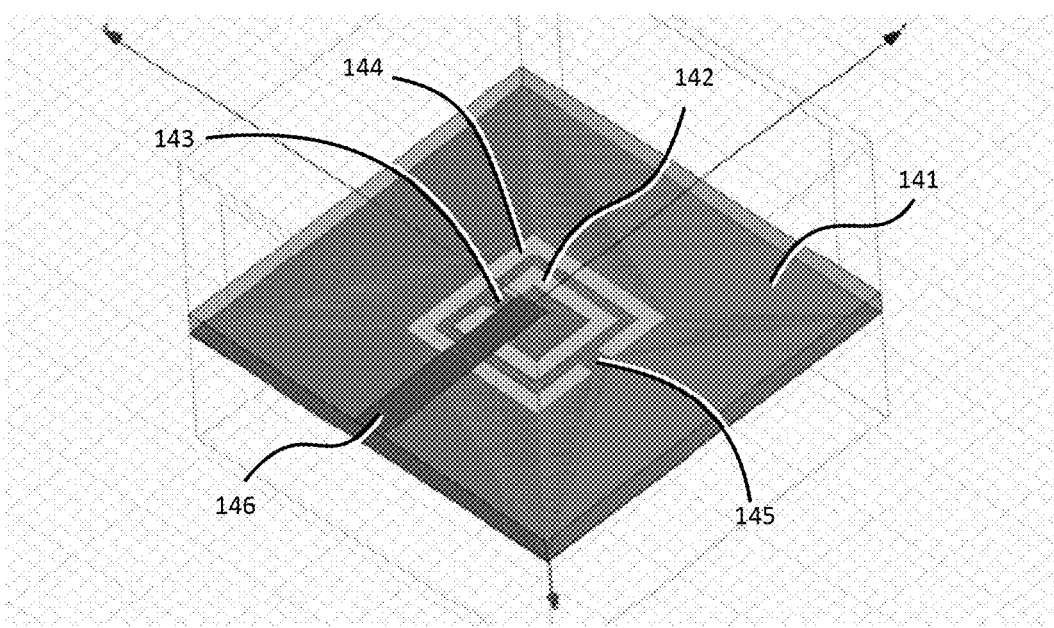

In each of the first second and third examples resonators 110, 120 and 130, the resonator is connected to each of a first and a second port, which may serve as input and output lines (or vice versa) for the resonator. However, in other examples, the resonators may be connected to a single port. For instance, FIG. 1D shows a fourth example metamaterial resonator 140 having a structure (e.g., rings 142/144, breaks 143/145) similar to that of the third example resonator 130, except that the resonator 140 is formed on a single substrate 141 and is connected to a single port 146. In the example of FIG. 1D, the single port 146 is an open ended microstrip line extending in a direction perpendicular to the direction of the breaks 143 and 145, although in other examples the breaks may extend in the same direction as the ports.

Figure 1E:
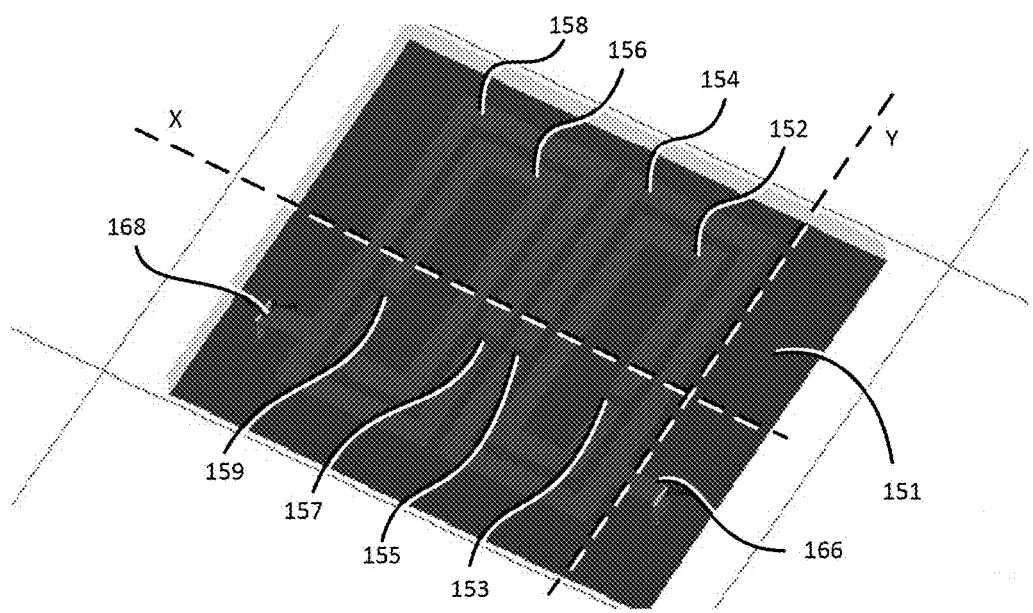

FIG. 1E shows a fifth example of a metamaterial resonator 150 in accordance with the present disclosure. The metamaterial resonator 150 is formed from a first pair of concentric split ring elements 152 and 154 formed adjacent to a second pair of concentric split ring elements 156 and 158 on a common surface of a substrate 151. In the example of FIG. 1E, each of the split ring elements is rectangular. The first pair of split ring elements is connected to a first port 166 extending from a first side of the substrate 151 along a first axis X, and second pair of split ring elements is connected to a second port 168 extending from a second side of the substrate 151 opposite the first side, also along the first axis X. The first and second ports 166 and 168 extend along a line of the first axis X, which in the example of FIG. 1E is offset from a midpoint of the substrate 151. The first and second pairs of split ring elements have line symmetry to one another along a second axis Y of the substrate perpendicular to the first axis X and, in the present example, bisects the resonator 150.

As with each of the split ring elements in the previous example resonators, each of the split ring elements 152/154/156/158 of the fifth example resonator 150 includes a break, 153, 155, 157 and 159, formed along the long edge of the respective ring element. In the example of FIG. 1E, for each of the concentric split ring element pairs, the respective breaks of the concentric split ring elements extend, in opposing directions, from a common point that is within the ring or annulus of each split ring element, but offset (e.g., along the long axis of the ring elements) from the center point of the ring elements. Each of the breaks 153, 155, 157 and 159 is formed along a line extending along the first axis X between the first and second sides of the substrate.

Figure 1F:
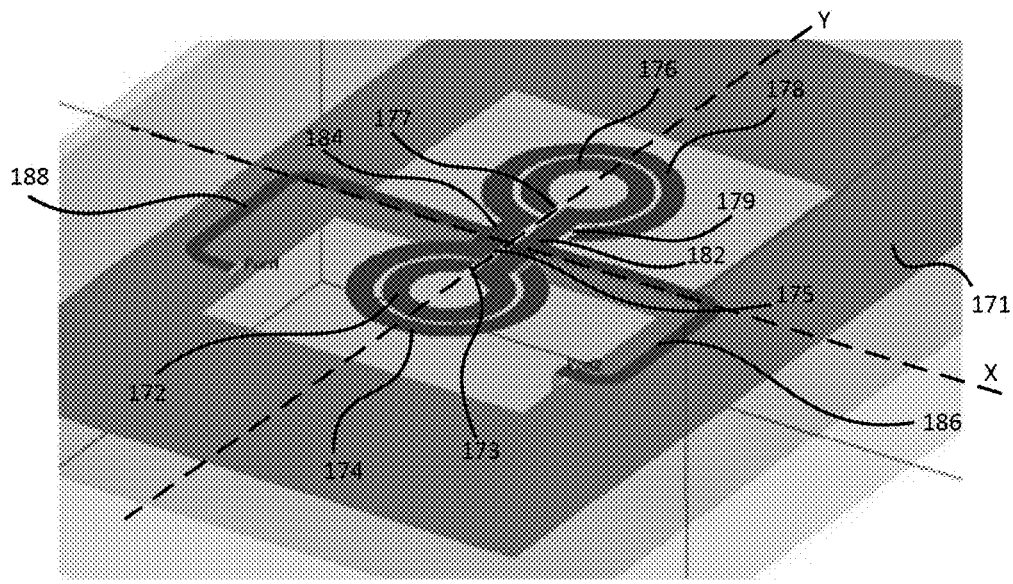

FIG. 1F shows a sixth example of a metamaterial resonator 170 in accordance with the present disclosure. The metamaterial resonator 170 is formed from a first pair of concentric split ring elements 172 and 174 formed adjacent to a second pair of concentric split ring elements 176 and 178 on a common surface of a substrate 171. In the example of FIG. 1F, each of the split ring elements is circular. The first pair of split ring elements is connected to a first port 186 extending from a first side of the substrate 171 along a first axis X, and second pair of split ring elements is connected to a second port 188 extending from a second side of the substrate 171 opposite the first side also along the first axis X, which in the present example bisects the resonator 170. The first and second ports 186 and 188 extend along a line of the first axis X, which in the example of FIG. 1F passes through a midpoint of the substrate 171. The first and second pairs of split ring elements have line symmetry to one another over the first axis X. Each of the inner ring elements 172/176, and each of the outer ring elements 174/178 is connected by first and second metamaterial connection lines, 182 and 184 respectively. Each of the metamaterial lines 182 and 184 extends in parallel to one another parallel a second axis Y of the substrate 171 perpendicular to the first axis X.

As with each of the split ring elements in the previous example resonators, each of the split ring elements 172/174/176/178 of the sixth example resonator 170 includes a break, 173, 175, 177 and 179. In the example of FIG. 1F, for each of the concentric split ring element pairs, the respective breaks of the concentric split ring elements extend along the second axis Y. The breaks 173 and 177 for each of the inner ring elements 172/176 is formed along a line (e.g., along the second axis Y) offset from a center point of the resonator in the direction of the second port 188. The breaks 175 and 179 for each of the outer ring elements 174/178 is formed along a line (e.g., along the second axis Y) offset from a center point of the resonator in the direction of the first port 186, with the first metamaterial connection line 182 extending through both breaks 175/179. In some examples, the substrate may include a ground plane (not shown) below each of the split ring elements, in which some of the material of the ground plane is etched out.

Figure 2A:
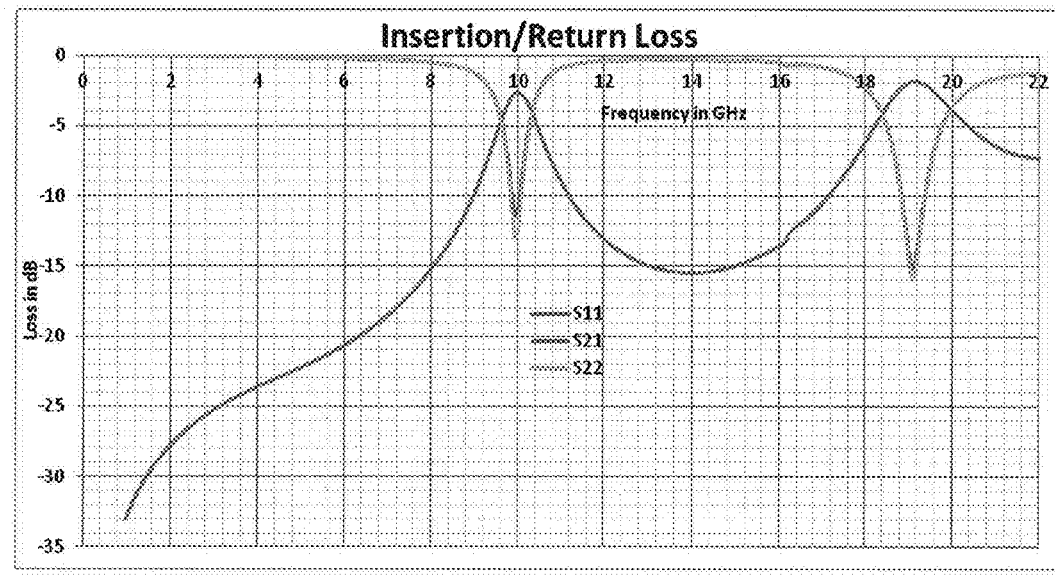
Figure 2B:
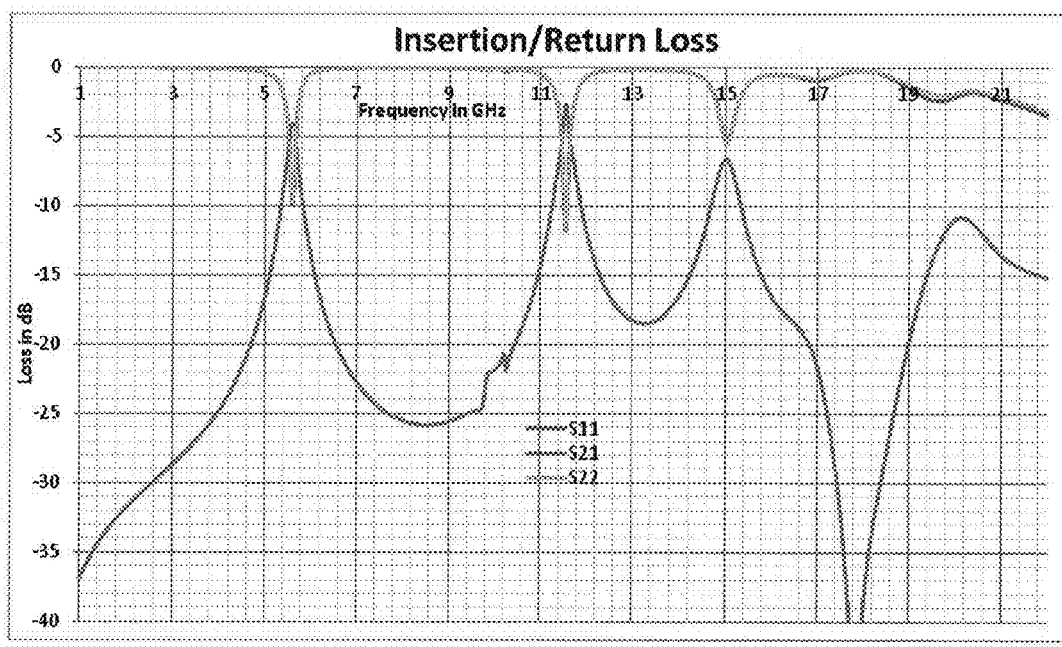
Figure 2C:
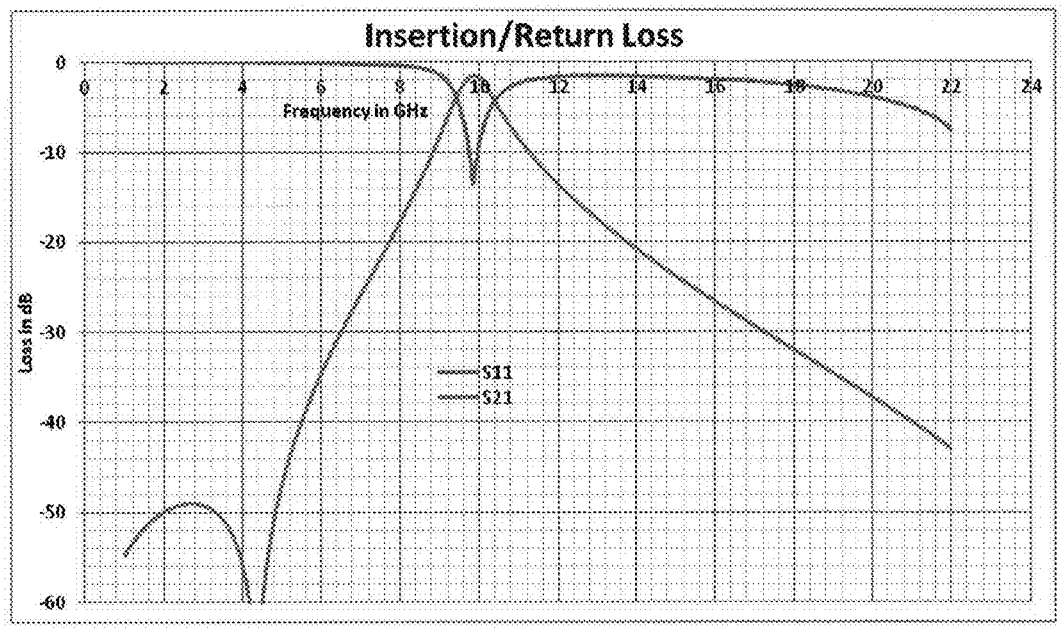
Figure 2D:
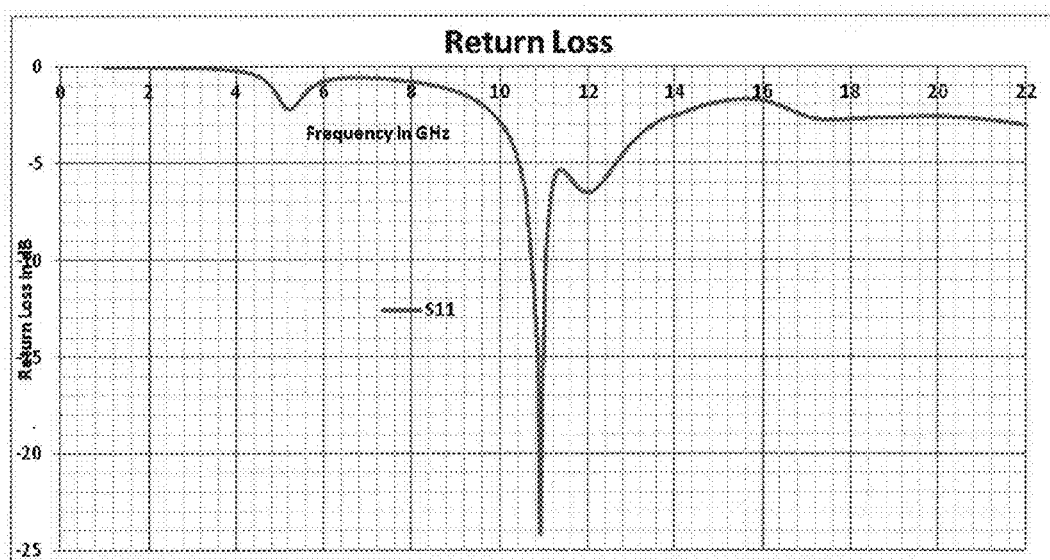
Figure 2E:
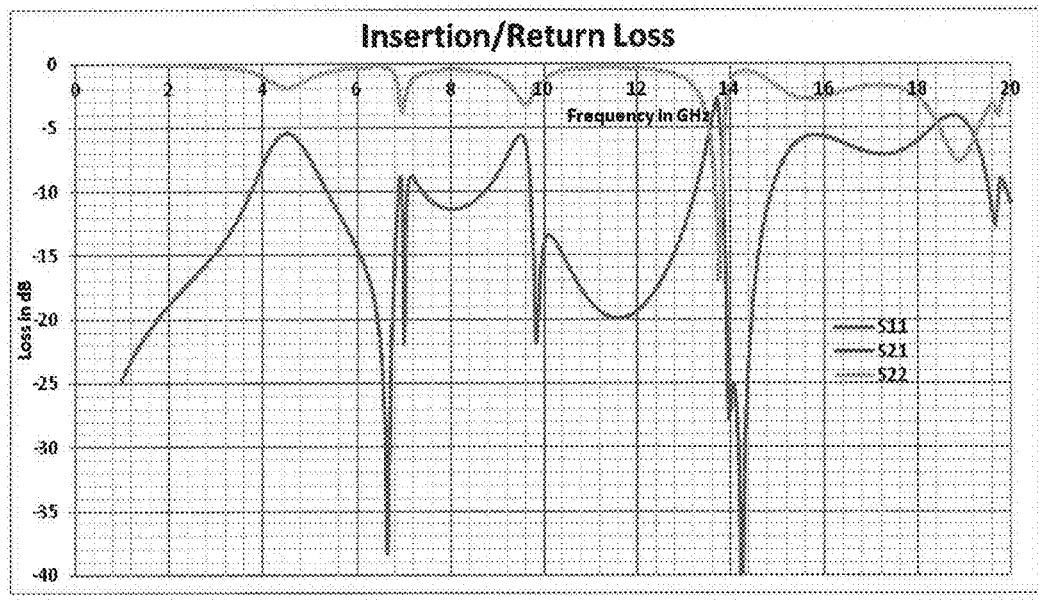
Figure 2F:
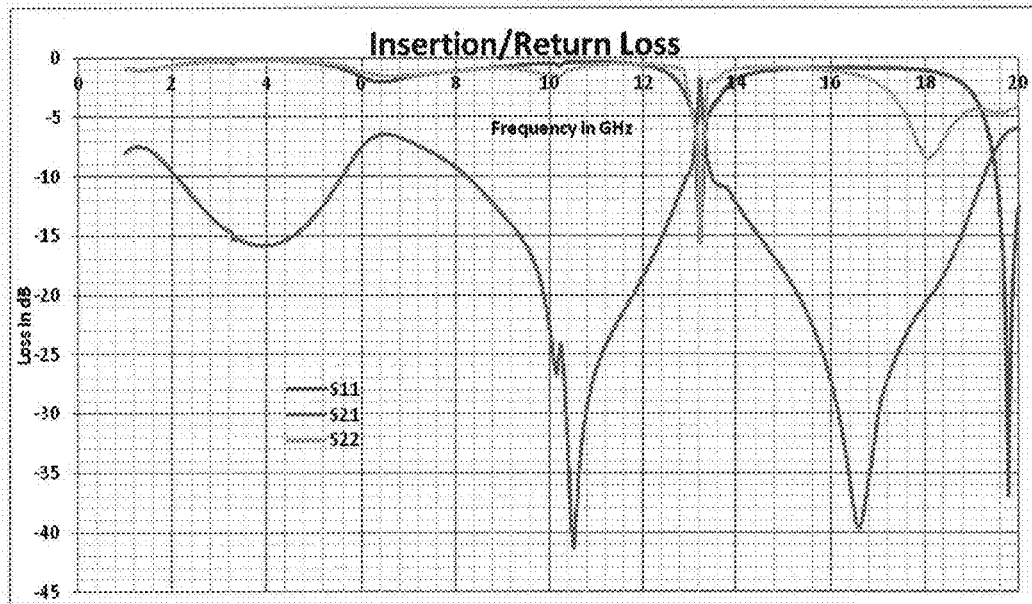

FIGS. 2A-2F show loss characteristics for each of the above example resonators 110, 120, 130, 140, 150 and 170, respectively. At the resonant frequencies of the respective resonators, transmission of electromagnetic waves is suppressed. This is shown in the plots of 2A-2F as a dip in the transmission characteristic for the respective resonators. As shown in FIG. 2A, the first example resonator 110 exhibits strong resonance at approximately 10 GHz and at approximately 19 GHz. As shown in FIG. 2B, the second example resonator 120 exhibits strong resonance at approximately 6 GHz, at approximately 12 GHz, and at approximately 15 GHz. As shown in FIG. 2C, the third example resonator 130 exhibits strong resonance at approximately 10 GHz. As shown in FIG. 2D, the fourth example resonator 140 exhibits strong resonance at approximately 11 GHz. As shown in FIG. 2E, the fifth example resonator 150 exhibits strong resonance at approximately 14 GHz. As shown in FIG. 2F, the sixth example resonator 170 exhibits strong resonance at approximately 13 GHz.

The above example resonators 110, 120, 130, 140, 150, and 170, or similarly designed resonators, may be incorporated into a voltage controlled oscillator in order to perform improved mode suppression with reduced phase noise, as compared to alternative solutions. The ports of the resonator may be connected to the voltage controlled oscillator. In this respect, each of the resonators may be used as a resonant circuit in another device, as compared to as a resonant negative permittivity/permeability medium (e.g., metamaterial cloaking device).

FIG. 3A shows a first example voltage controlled oscillator 315 including an oscillating circuit and a metamaterial resonator 310 having structural and operational properties similar to those of the first example resonator 110. The oscillating circuit outputs an electric signal at a given frequency based at least in part on one or more inputs provided to the VCO and/or inherent noise or a nonlinearity in an active part of the VCO. Like the first example resonator 110, resonator 310 is made of concentric circular split ring elements connecting opposing first and second ports. However, unlike the first example resonator 110, which includes only two split ring elements, resonator 310 includes four split ring elements, each of the split ring elements having a break that extends along a line, the breaks of each adjacent split ring elements extending from a center point of the resonator 310 in opposite directions. Generally, including more split rings in an SRR will increase the quality factor of the SRR, but with greater losses. In designing a voltage controlled oscillator, the number of split rings may be chosen to balance the quality factor and loss needs.

FIG. 3B shows a second example voltage controlled oscillator 325 including an oscillating circuit and a metamaterial resonator 320 having structural and operational properties similar to those of the second example resonator 120. Like the second example resonator 120, resonator 320 is made of concentric rectangular split ring elements connecting opposing first and second ports. However, unlike the second example resonator 120, which includes only two split ring elements, resonator 320 includes four split ring elements, each of the split ring element having a break that extends along a line, the breaks of each adjacent split ring elements extending from a center point of the resonator 320 in opposite directions.

Figure 3C:
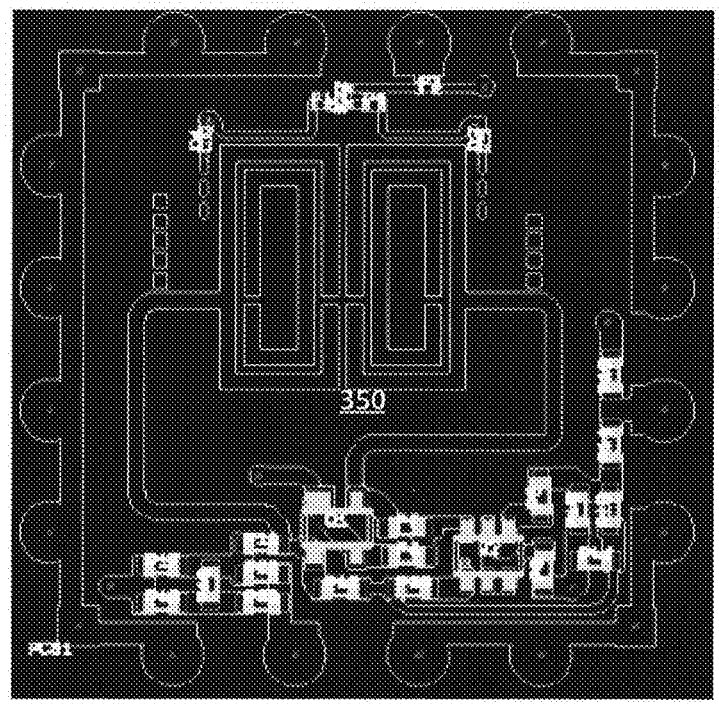

FIG. 3C shows a third example voltage controlled oscillator 355 including an oscillating circuit and a metamaterial resonator 350 having structural and operational properties similar to those of the fifth example resonator 150. Cascading split rings in an SRR will increase the quality factor of the SRR (e.g., according to the Q-multiplication effect), but again with the effect of increased signal losses. In designing a voltage controlled oscillator, the number of split rings may be chosen to balance the quality factor and loss needs.

Figure 3D:
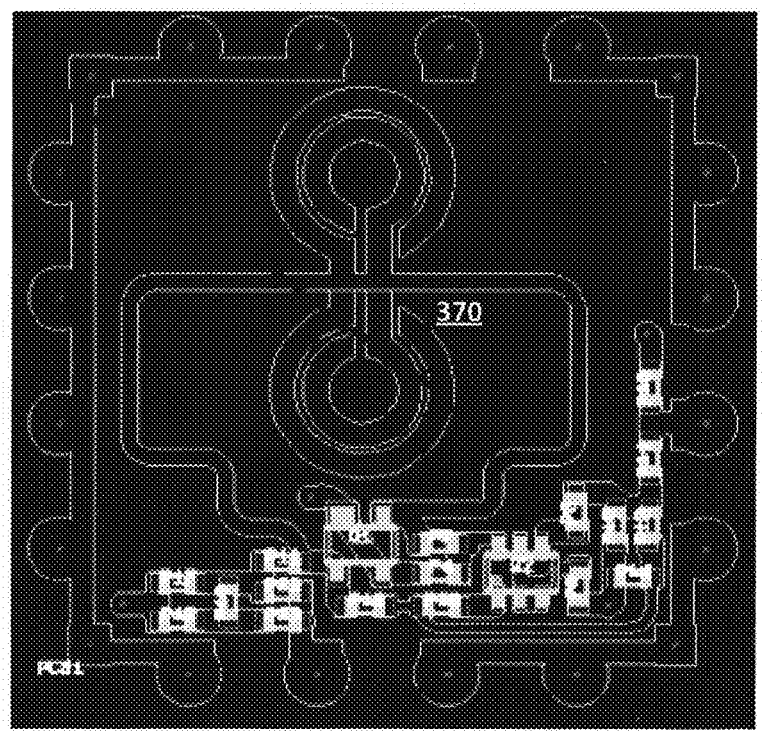

FIG. 3D shows a fourth example voltage controlled oscillator 375 including an oscillating circuit and a metamaterial resonator 370 having structural and operational properties similar to those of the sixth example resonator 170.

Figure 4A:
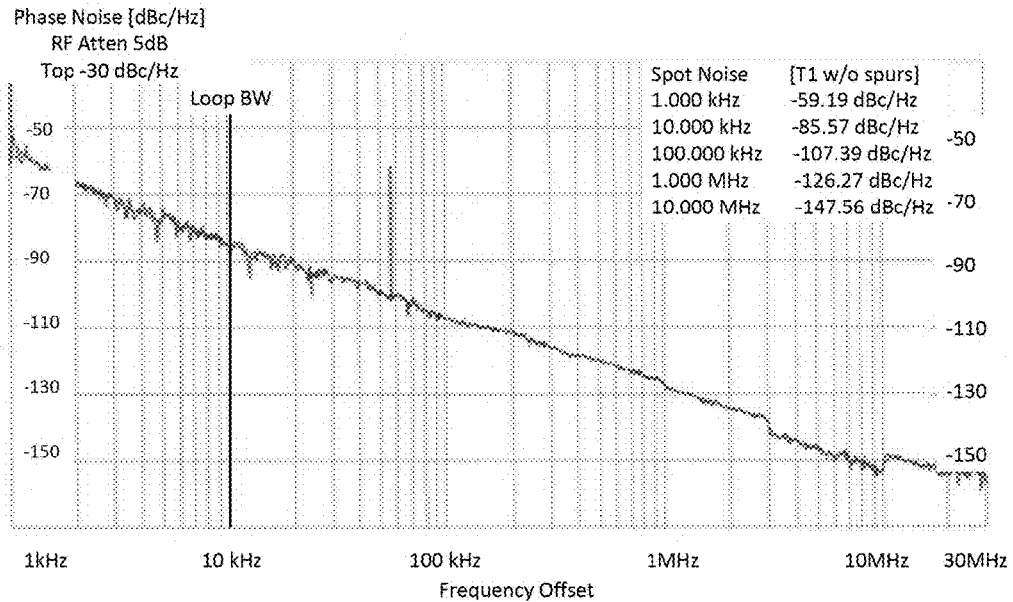
Figure 4B:
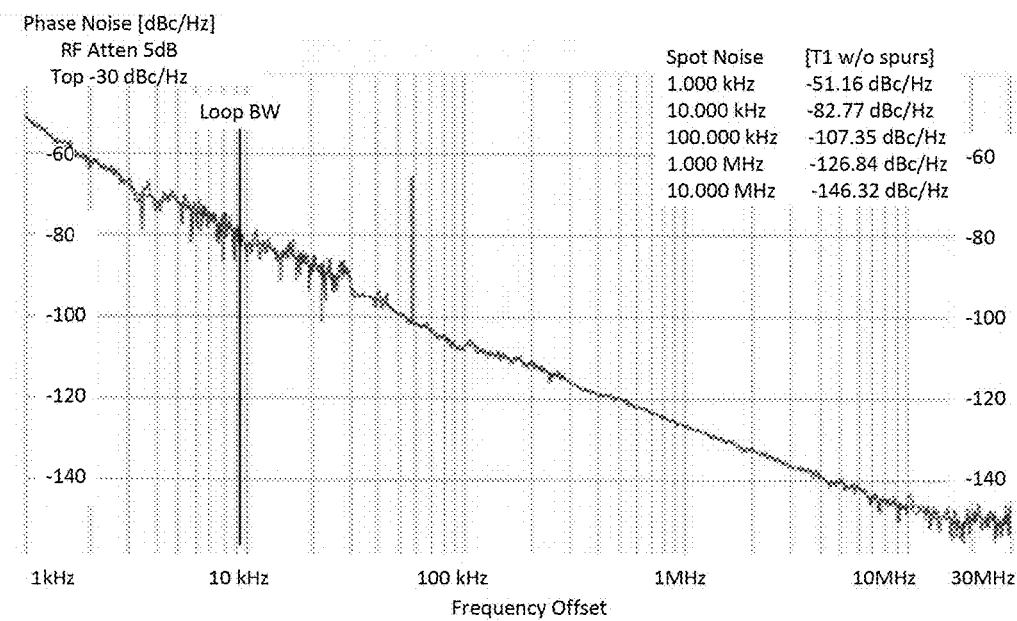
Figure 4C:
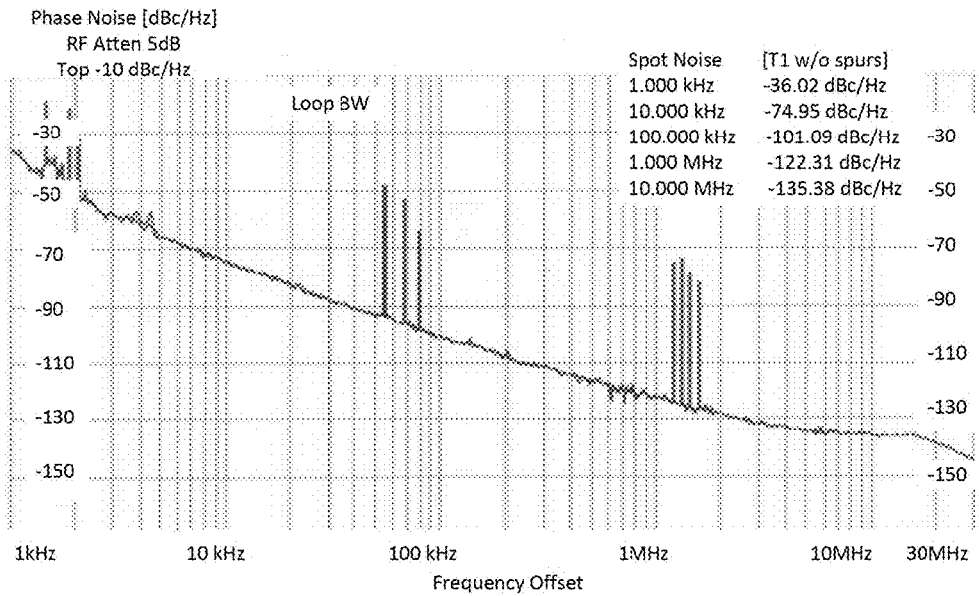
Figure 4D:
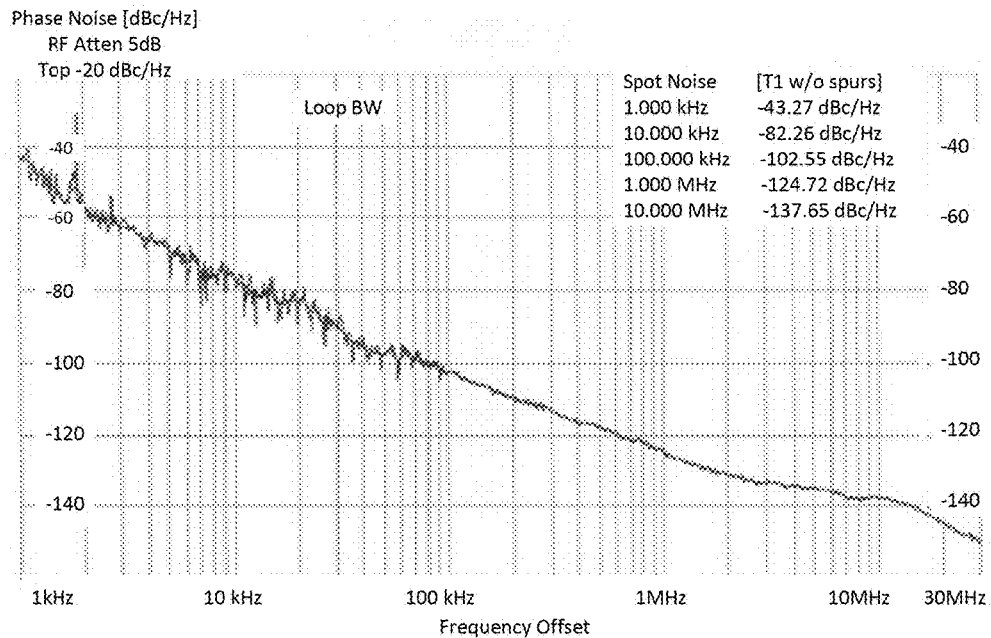

FIGS. 4A-4D show phase noise characteristics for each of the above example voltage controlled oscillators 315, 325, 355, and 375, respectively. In the example of FIG. 4A, the first example oscillator 315 is set to a signal frequency of about 10 GHz and exhibits phase noise as low as about e.g., 59 dBc/Hz at an offset of about 1 kHz, as low as about e.g., 85 dBc/Hz at an offset of about 10 kHz, as low as about e.g., 107 dBc/Hz at an offset of about 100 kHz, as low as about e.g., 126 dBc/Hz at an offset of about 1 MHz, and as low as about e.g., 147 dBc/Hz at an offset of about 10 MHz. In the example of FIG. 4B, the second example oscillator 325 is set to a signal frequency of about 12 GHz and exhibits phase noise as low as about e.g., 51 dBc/Hz at an offset of about 1 kHz, as low as about e.g., 82 dBc/Hz at an offset of about 10 kHz, as low as about e.g., 107 dBc/Hz at an offset of about 100 kHz, as low as about e.g., 126 dBc/Hz at an offset of about 1 MHz, and as low as about e.g., 148 dBc/Hz at an offset of about 10 MHz. In the example of FIG. 4C, the third example oscillator 355 is set to a signal frequency of about 9 GHz and exhibits phase noise as low as about e.g., 36 dBc/Hz at an offset of about 1 kHz, as low as about e.g., 75 dBc/Hz at an offset of about 10 kHz, as low as about e.g., 101 dBc/Hz at an offset of about 100 kHz, as low as about e.g., 122 dBc/Hz at an offset of about 1 MHz, and as low as about e.g., 135 dBc/Hz at an offset of about 10 MHz. In the example of FIG. 4D, the fourth example oscillator 375 is set to a signal frequency of about 8 GHz and exhibits phase noise as low as about e.g., 43 dBc/Hz at an offset of about 1 kHz, as low as about e.g., 76 dBc/Hz at an offset of about 10 kHz, as low as about e.g., 103 dBc/Hz at an offset of about 100 kHz, as low as about e.g., 125 dBc/Hz at an offset of about 1 MHz, and as low as about 138 dBc/Hz at an offset of about 10 MHz.

The above metamaterial resonator designs may also be combined with one or more möbius strip resonators to improve operation of a device, such as a VCO. A möbius strip is conformal, continuous, and maps one-to-one onto itself. A signal coupled to a möbius strip does not encounter any obstruction when travelling around the multi-knot loop, in such a way that the loop acts like an infinite transmission line, enabling very high group delay. Thus, möbius coupled planar resonators provide an alternative to the complex circuitry needed to achieve high Q-factor in hybrid coupling techniques. In this respect, the present disclosure is also directed to möbius resonators that may be used in combination with the above and similar metamaterial resonator designs.

Figure 5A:
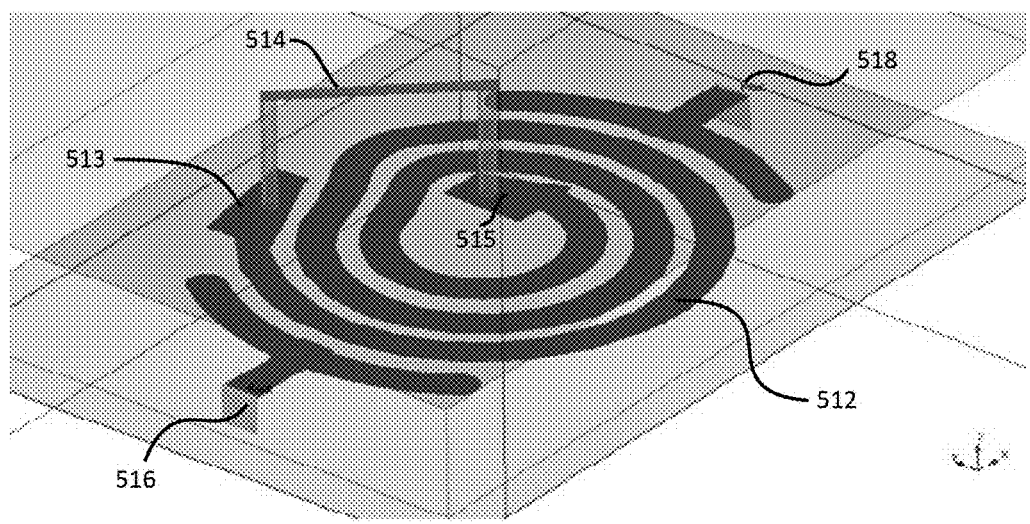

FIG. 5A shows a first example möbius resonator 510 in accordance with the present disclosure. The resonator 510 is made up of a resonator element 512 formed in a substantially planar configuration on a surface of a substrate 511, and a pair of ports 516 and 518 on opposing ends of the substrate 511. The resonator element 512 is wrapped in a substantially planar spiral around the centerpoint of the resonator 510. In the example of FIG. 5A, the spiral extends for about three revolutions, although in other examples, the spiral may extend for more (e.g., about 4) or fewer (e.g., about 2) revolutions. As used in the present disclosure, the term "spiral" should be understood to include both curves that begin at the centerpoint and wrap around the centerpoint, as well as curves that wrap around the centerpoint beginning at a location radially apart from the centerpoint, thereby leaving a break or opening at the center of the resonator. The ports 516 and 518 may be curved, as in FIG. 1A, to maintain a space of uniform width between the port and the resonator element 512.

A first end 513 and a second end 515 of the resonator element may be connected through a via transition 514 over another metallic surface (not shown). In the example of FIG. 5A, each of the vias connecting the first and second ends 513 and 515 of the resonator element 512 extends transverse to the plane of which the resonator element 512 is formed. The via transition may include, for example, a wire bond, or may be formed on a multiplanar printed circuit board (PCB). This connection effectively turns the resonator into a möbius strip, thus raising the quality factor of the resonator.

Figure 5B:
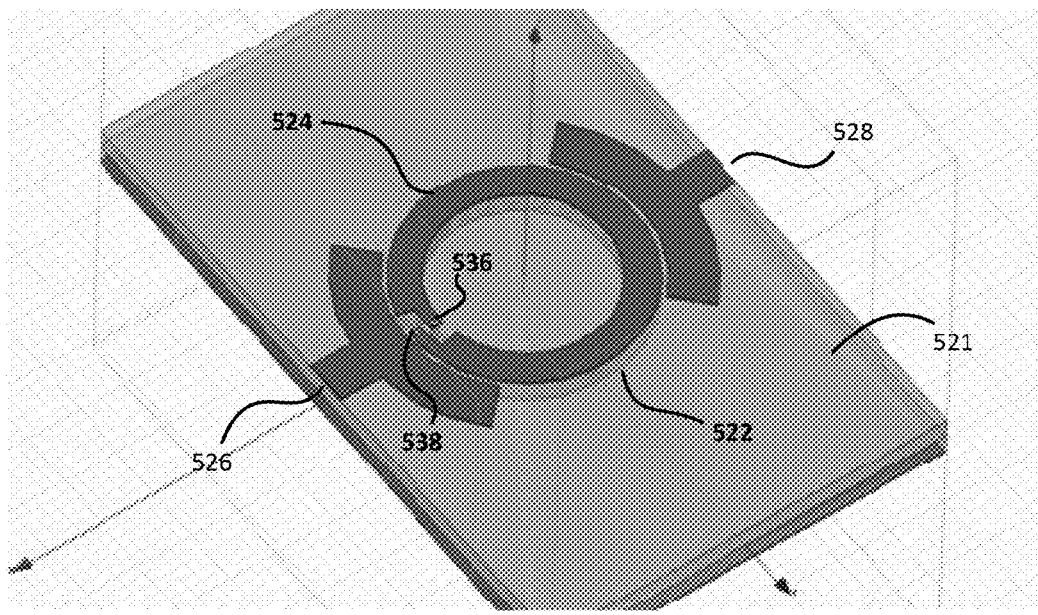

FIG. 5B shows a second example möbius resonator 520 in accordance with the present disclosure. The second example möbius resonator 520 is made up of a pair of split ring elements 522 and 524 formed on different planes of a multiplanar PCB 521, and a pair of ports 526 and 528 on opposing ends of the multiplanar printed circuit board (PCB) 521. Each split ring element includes a respective break. In the example of FIG. 5B, the breaks are radially aligned with one another, and each break defines a first and second end of the respective split ring element. The resonator 520 further includes a first via transition 536 connecting a first end of the first split ring element 522 to a second end of the second split ring element 524, and a second via transition 538 connecting a second end of the first split ring element 522 to a first end of the second split ring element 524. Each of the vias extends transverse between the respective planes of the multiplanar PCB on which the split ring elements are formed. The result of the via connections between the first and second split ring resonators is that current moving from any point on the resonator elements must traverse both elements before reaching back to the start point. In this respect, the resonator functions as a möbius strip and exhibits a relatively high quality factor, as compared to a resonator of similar structure but without a möbius strip connection.

Figure 5C:
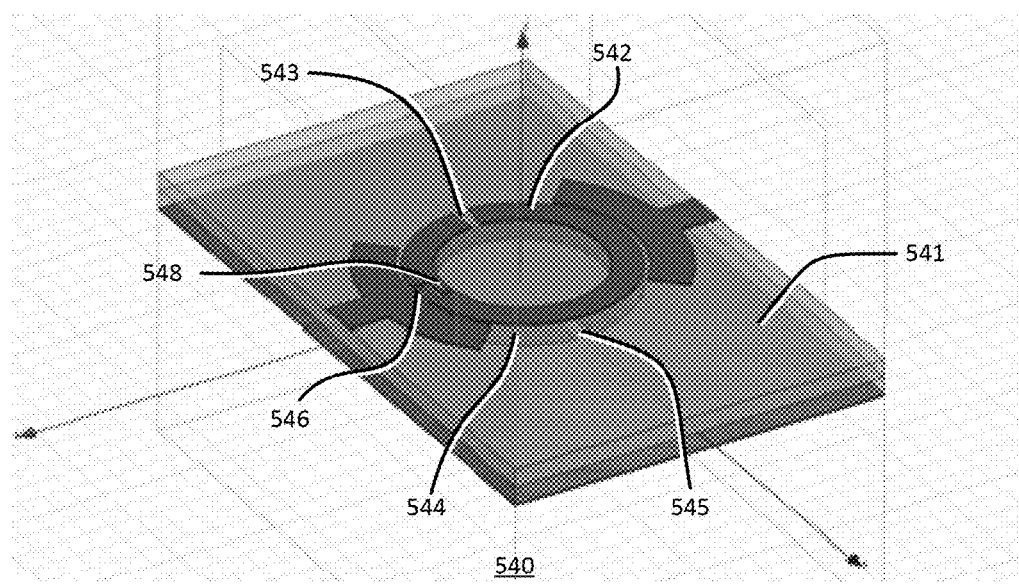

FIG. 5C shows a third example möbius resonator 540 in accordance with the present disclosure. The structure of the third example möbius resonator 540 may be compared to that of the second example möbius resonator 520 of FIG. 5B (e.g., split ring elements 542 and 544 on different planes of a multiplanar PCB 541 and connected to one another through via transitions 546 and 548 to form a möbius strip), except that each of the split ring elements 542 and 544 further include an additional split or break 543 and 545, respectively. Each of the breaks 543 and 545 extends radially from a centerpoint of the respective elements 542 and 544, and extend radially from their respective centerpoints in opposite directions from one another, and on different planes of the PCB 541. In the example of FIG. 5C, the breaks are separated from the via transition points by approximately 90 and −90 degrees, respectively, around the circumference of the elements 542 and 544. Each of the vias extends transversely between the respective planes of the multiplanar PCB on which the split ring elements are formed. It has been found that the breaks of the third example resonator 540 cause the resonant frequency of the resonator to move to a lower frequency, as compared to a resonator without such breaks (e.g., the second example resonator 520).

Figure 5D:
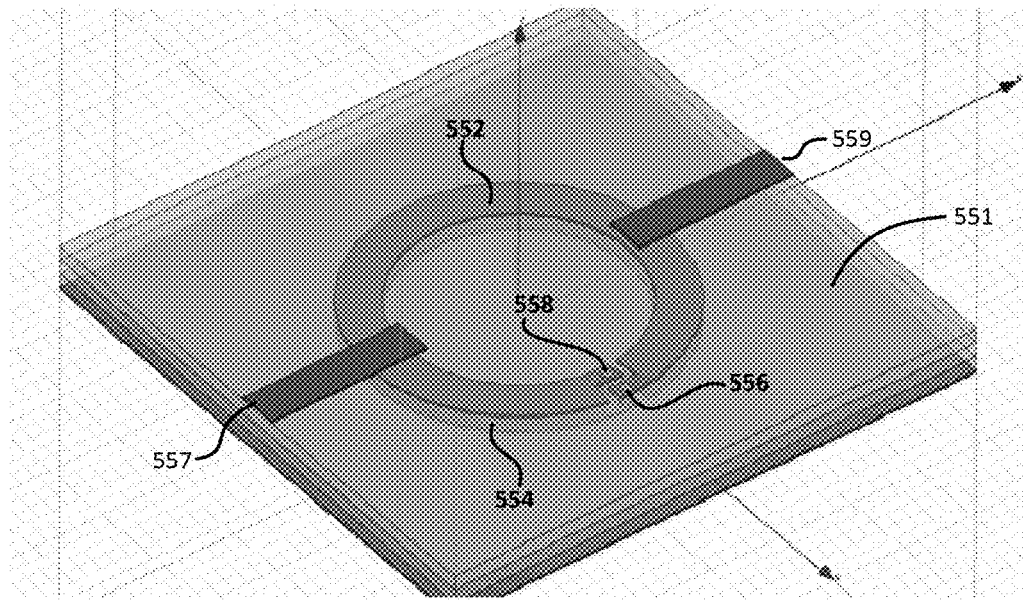

FIG. 5D shows a fourth example möbius resonator 550 in accordance with the present disclosure. The structure of the fourth example möbius resonator 550 may be compared to that of the second example möbius resonator 520 of FIG. 5B (e.g., split ring elements 552 and 554 on different planes of a multiplanar PCB 551 and connected to one another through via transitions 556 and 558 to form a möbius strip), except that the structure is of the fourth example möbius resonator 550 is located enturely within the intermediate layers of a multiplanar PCB and the structures of the input and output ports 557 and 559 have been changed and are on a different plane as compared to the rings of the möbius structure. Specifically, the ports in FIG. 5D are substantially linear microstrips extending from opposing ends of the PCB 551 in a direction perpendicular to the splits in the split ring elements 552 and 554. The change in port structure affects the way broadside feeding and collection of the electric signals to and from the resonator 550 is performed.

Figure 5E:
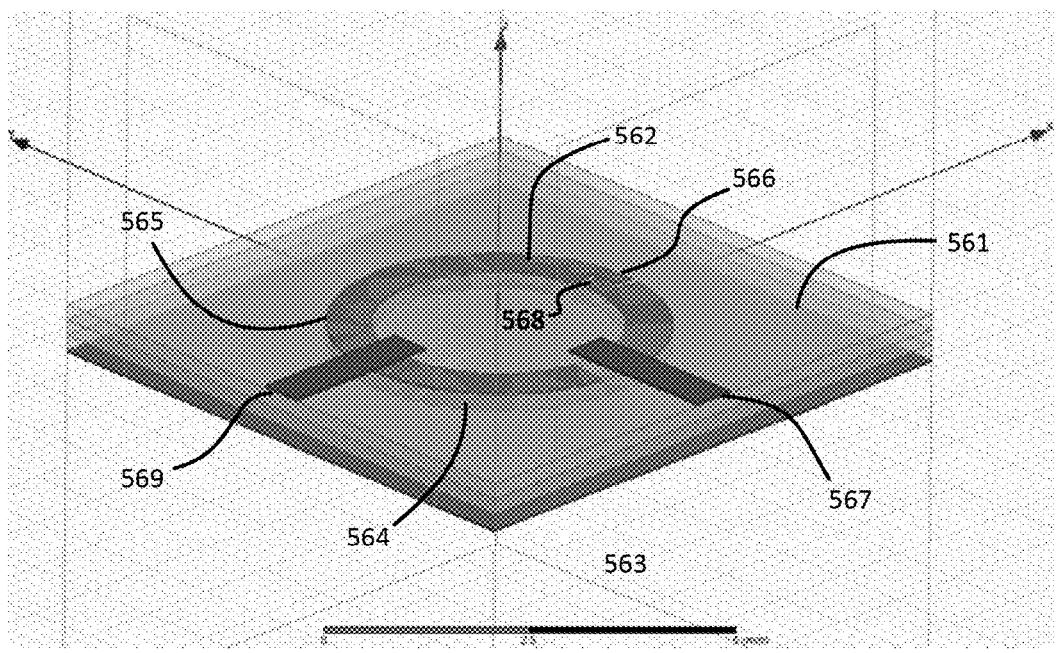

FIG. 5E shows a fifth example möbius resonator 560 in accordance with the present disclosure. The structure of the fifth example möbius resonator 560 may be compared to that of the fourth example möbius resonator 550 of FIG. 5D (e.g., split ring elements 562 and 564 on different planes of a multiplanar PCB 561 and connected to one another through via transitions 566 and 568 to form a möbius strip, and to microstrip ports 567 and 569), except that the placement of the ports 567 and 569 has been changed, and a break 563/565 has been added to each of the split ring elements (like in the example of FIG. 5C). Specifically, in FIG. 5E, the break 563 of the split ring element on the top plane of the PCB 561 is located where the signal is collected, and the break 565 of the split ring element on the lower plane is located directly underneath the location at which the electric signal is broadside coupled between the split ring element on the top plane and the input port. In this respect, the ports are radially separated by approximately 90 degrees around the circumference of the elements 562 and 564.

Figure 6A:
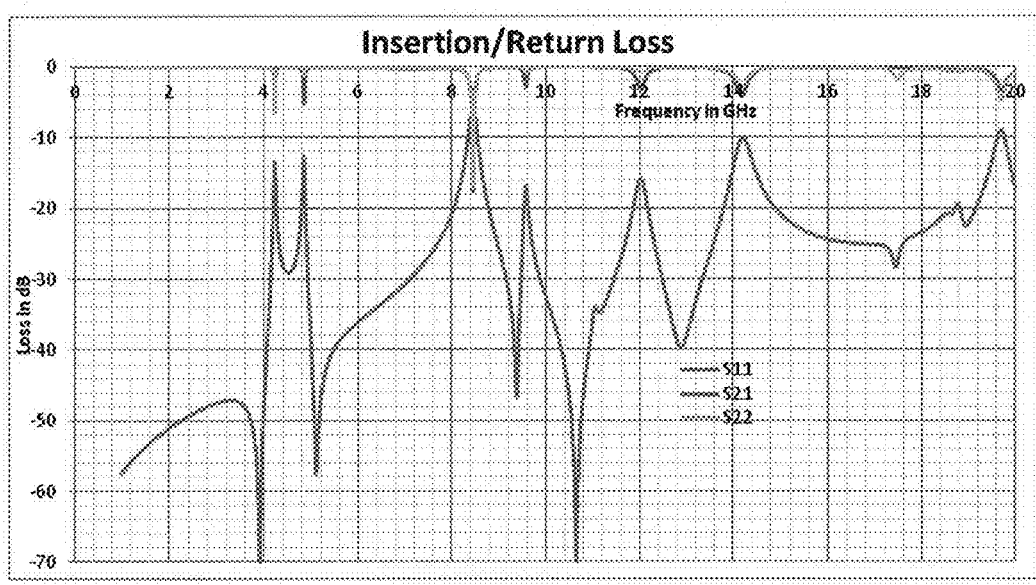
Figure 6B:
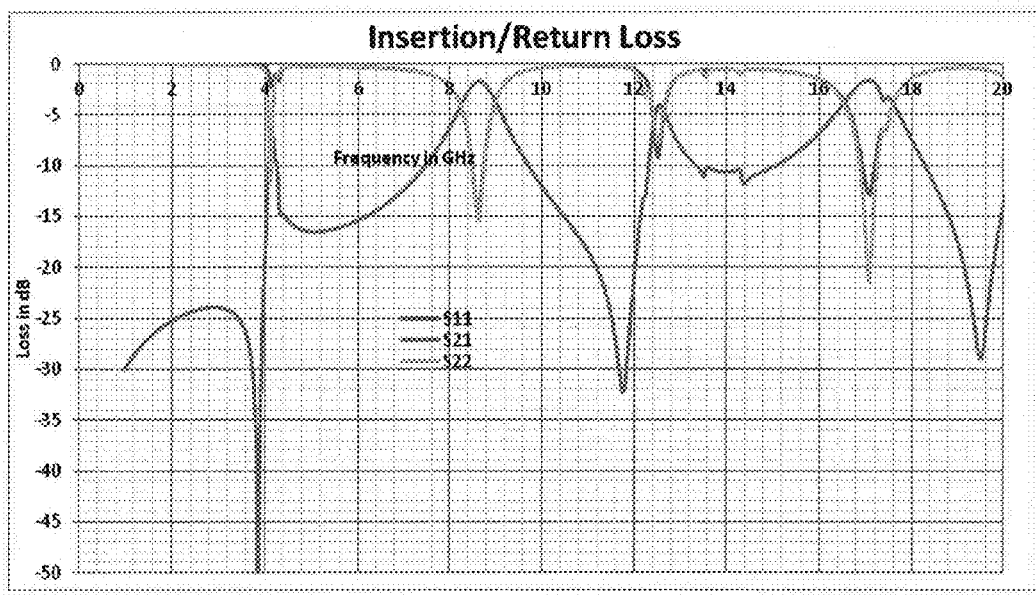
Figure 6C:
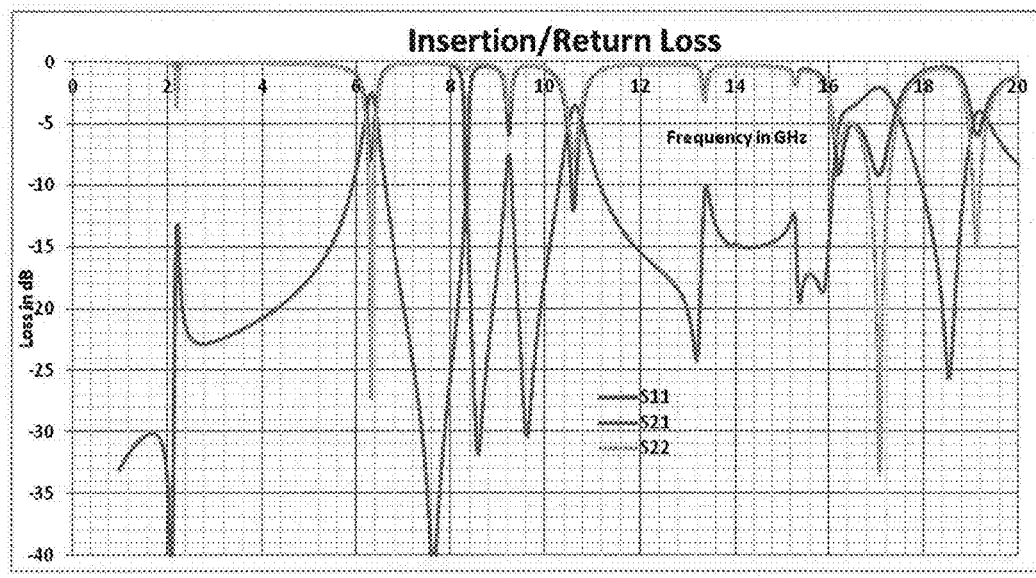
Figure 6D:
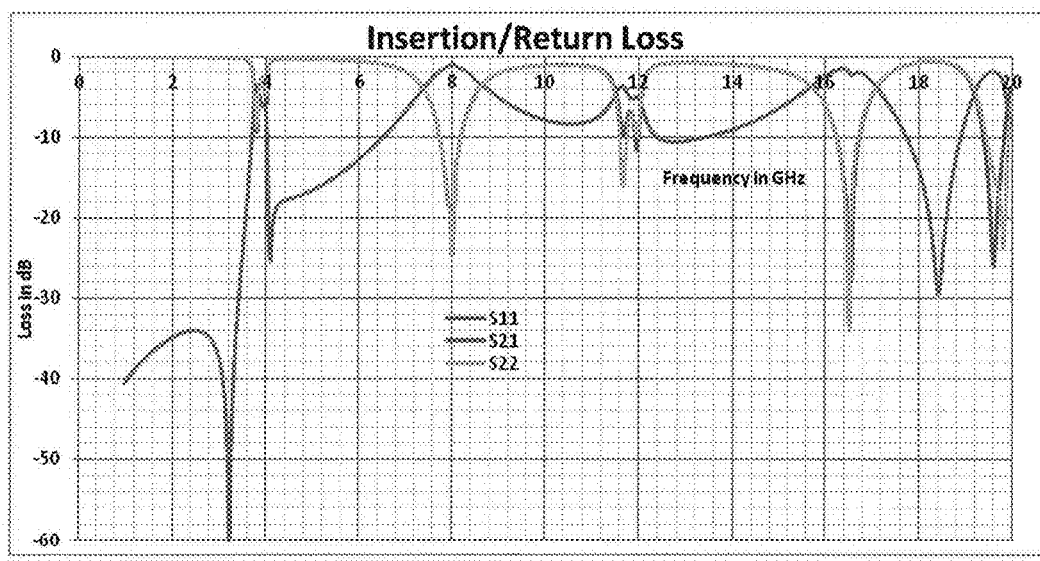

Advantageously, it has been found that the resonant frequency of möbius strip resonators (e.g., the resonators of FIGS. 5A-5E) is nearly half of that for a standard split ring resonator having the same ring dimensions (e.g., same radius). Thus, introduction of möbius strip structures in the formation of resonators, such as metamaterial resonators, may be beneficial for lowering the resonant frequency of such resonators. This helps to mitigate fabrication issues for devices that are required to work at relatively low frequencies (e.g., kHz, MHz range) without the structures becoming too big to accommodate in miniaturized packages. FIGS. 6A-6E show loss characteristics for each of the above example resonators 510, 520, 540, 550 and 560, respectively. As shown in FIG. 6A, the first example möbius resonator 510 exhibits strong resonance at approximately 8.5 GHz. As shown in FIG. 6B, the second example möbius resonator 520 exhibits strong resonance at approximately 8.6 GHz. As shown in FIG. 6C, the third example möbius resonator 540 exhibits strong resonance at approximately 6.3 GHz. As shown in FIG. 6D, the fourth example möbius resonator 550 exhibits strong resonance at approximately 4 GHz and at approximately 8 GHz.

Figure 6E:
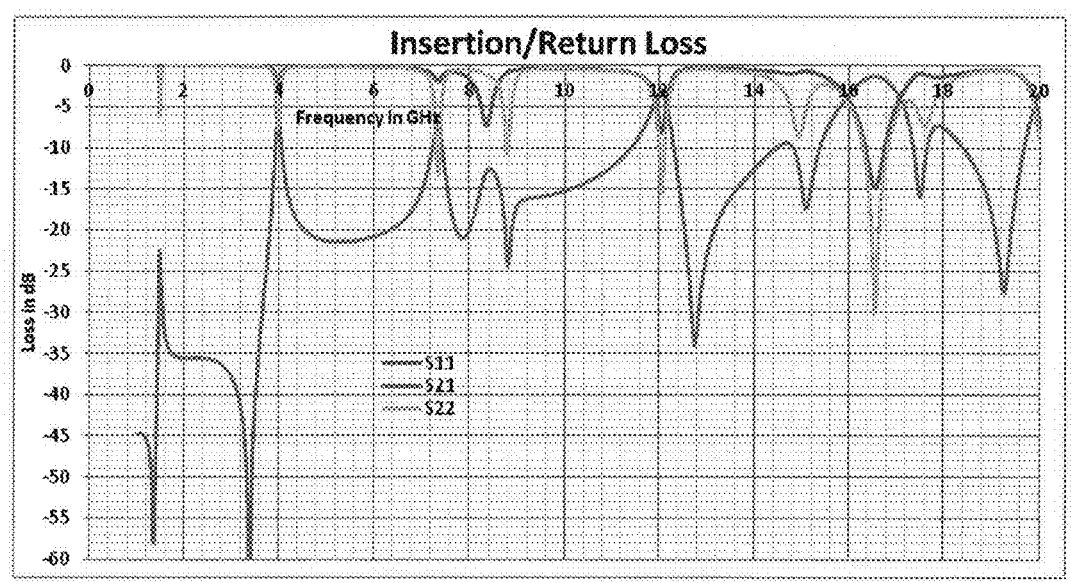

The möbius resonator examples of 560/540, by virtue of the presence of both breaks 563/543 and 565/545 and a möbius structure, may be termed metamaterial möbius resonators. As shown in FIG. 6E, the fifth example möbius resonator 560 exhibits strong resonance at even less than about 2 GHz, as well as at approximately 4 GHz.

FIG. 7 shows the resonance properties of an example metamaterial möbius resonator, as compared to a metamaterial split-ring resonator and möbius strip resonator having similar resonant frequencies. As shown in FIG. 7, each of the example resonators has a resonant frequency of about 10 GHz. However, the metamaterial möbius resonator exhibits stronger resonance at the 10 GHz frequency than do the other example resonators, resulting in lower losses. Furthermore, the other resonators exhibit relatively strong signals at higher order modes (e.g., at about 10.75 GHz for the möbius strip resonator, at about 11 GHz for the metamaterial resonator). By contrast, the metamaterial möbius resonator exhibits high suppression of higher order modes, without sacrificing quality factor and even with an improvement to the total loss characteristics. This is achieved by harnessing the benefits of each of the metamaterial resonators and the möbius strip resonators in a single design. The metamaterial resonator of the design provides the improved suppression of higher order modes, while the möbius strip of the design provides for a superior quality factor (e.g., as compared to a metamaterial resonator of similar ring dimensions).

FIG. 8 shows a plan view design of a voltage controlled oscillator 800 including an oscillating or tuning circuit 850 and a resonator 810 having both metamaterial and möbius components. The oscillating circuit outputs an electric signal at a given frequency based at least in part on one or more inputs provided to the VCO and/or inherent noise or a nonlinearity in an active part of the VCO. As shown in FIG. 8, the resonator 810 includes four split ring resonators 822, 824, 826 and 828 distributed in a four-pole edge-coupled filter array. Split ring resonators 822 and 824 form a first pair of square resonant elements, and split ring resonators 826 and 828 form a second pair of square resonant elements disposed adjacent to the first pair of resonant elements. Each resonant element includes a single break (823, 825, 827 and 829 respectively). Each of the breaks of the first pair of resonant elements 823 and 825 extend along a first line (e.g., first axis X) of the voltage controlled oscillator 800, and each of the breaks of the second pair of resonant elements 827 and 829 extend on a second line parallel to the first line. The breaks of the first pair of resonant elements 823 and 825 are located on opposing sides of the second pair of resonant elements, and the breaks of the second pair of resonant elements 827 and 829 are located directly adjacent to one another.

Each split ring resonator further includes a respective möbius strip resonator 832, 834, 836 and 838 located at about the centerpoint of the respective split ring resonator. The resonator 810 of the example of FIG. 8 also includes a mode suppression ring 840 to provide for further improved mode suppression.

FIG. 9 shows phase noise characteristics for the example voltage controlled oscillator of FIG. 8. In the example of FIG. 9, the oscillator 800 is set to a signal frequency of about 10 GHz and exhibits phase noise as low as about e.g., 85 dBc/Hz at an offset of about 1 kHz, as low as about e.g., 115 dBc/Hz at an offset of about 10 kHz, as low as about e.g., 140 dBc/Hz at an offset of about 100 kHz, as low as about e.g., 161 dBc/Hz at an offset of about 1 MHz, and as low as about e.g., 175 dBc/Hz at an offset of about 10 MHz.

The previously described (or similar) metamaterial resonator designs may also be integrated with a substrate integrated waveguide (SIW) in order to improve operation of a resonator application device, such as a VCO. An SIW is a waveguide-like planar structure that brings together the performance improvements attributable to waveguides with the ease of fabrication attributable to planar structures. Generally, an SIW is formed by adding a top metal layer over a ground plane layer and connecting the layers around their respective perimeters with plated vias. An electromagnetic wave in an SIW structure behaves like it is in a dielectrically-filled rectangular waveguide. The size of the SIW dictates the resonant frequency of the structure. Adding a complementary resonator (e.g., SRR) to the SIW can have the effect of raising or lowering the resonant frequency, depending on the properties of the complementary resonator. In the case of adding a metamaterial resonator, this addition can also increase the quality factor of the resonance. In this respect, the present disclosure is also directed to SIWs that may be used in combination with the above described and similar metamaterial resonator designs.

FIG. 10A shows a first example SIW resonator 1010. The resonator 1010 is made up of an SIW 1012 and a complementary split ring metamaterial resonator 1014 formed on a surface of the SIW 1012. The SIW is formed on a substrate 1015 (e.g., a soft board) by adding a top metal layer 1016 over the ground plane metal layer (not shown) of the substrate 1015. The top and ground layers are connected on each side of the substrate by respective rows of plated vias 1017. In the example of FIG. 10A, the substrate 1015 includes six or seven vias on each side. The distance between vias, the dimension of the vias, and the dimension of top metal layer and input/output feeding/extraction points may each affect the resonant frequency and loss characteristics of the structure.

In the example of FIG. 10A, the complementary split ring metamaterial resonator 1014 substantially resembles the structure of the second example metamaterial resonator 120 of FIG. 1B. For instance, the split ring metamaterial resonator 1014 of FIG. 10A includes two concentric square-shaped split ring elements having a common center and breaks extending from the common center in opposite directions. The SIW resonator 1010 also includes first and second ports 1018 and 1019 on opposing ends of the substrate 1015. In the example of FIG. 10A, the ports are microstrip lines extending from a respective opposing ends of the SIW towards the split ring metamaterial resonator 1014. The ports 1018 and 1019 and breaks in the split ring metamaterial resonator 1014 are formed along a line on a first axis X of the resonator 1010.

FIG. 10B shows a second example SIW resonator 1020. The resonator 1020 includes an SIW 1022 and first and second ports 1028 and 1029 comparable to the SIW and ports of the first example SIW resonator of FIG. 10A, and a different variety of a coupled-ring metamaterial resonator 1024 formed on a surface of the SIW 1022. Specifically, the coupled-ring metamaterial resonator 1024 includes a single circular ring having first and second breaks 1023 and 1025 on opposing sides of the ring and aligned with the first and second ports 1028 and 1029. The structure 1024 is the complementary of a differentially excited coupled-ring resonator and the complement helps in converting the differential excitation to a single ended excitation and hence in incorporating it in the unbalanced SIW resonator. At each of the breaks, the broken ends of the ring extend in the direction of the first axis X towards the first port 1028.

FIG. 10C shows a third example SIW resonator 1030. The resonator 1030 includes an SIW 1032 and complementary metamaterial resonator 1034 comparable to the SIW and metamaterial resonator of FIG. 10B, but includes only one port (e.g., a first port 1038 towards which the broken ends of the ring extend).

FIGS. 11A and 11B show loss characteristics for the example SIW resonators of FIGS. 10A and 10B, respectively. As shown in FIG. 11A, the first example SIW resonator 1010 exhibits strong resonance at approximately 25 GHz. As shown in FIG. 11B, the second example möbius resonator 1020 exhibits strong resonance at approximately 18 GHz.

FIG. 12 shows a plan view of a voltage controlled oscillator 1200. The voltage controlled oscillator includes an oscillating or tuning circuit 1240 and an SIW resonator 1210 similar to the resonator 1030 of FIG. 10C (e.g., including an SIW 1212, complementary metamaterial resonator 1014, and a single port 1218, all structurally comparable to that of FIG. 10C). The port 1218 is electrically connected to the gate of a transistor 1220 (e.g., a hetero-junction FET), the transistor in turn being capacitively coupled to an output 1230 of the VCO 1200. The complementary metamaterial resonator 1014 is connected to a tuning circuit 1240 through first and second varactor diodes 1242 and 1242 located on opposing sides of the complementary metamaterial resonator 1214. In the example of FIG. 12A, the oscillator 1200 shown is adapted to achieve a phase noise of about −115.2 dBc/Hz at a 1 MHz offset from an oscillation frequency of about 5.09 GHz.

FIG. 13A shows tuning characteristics of the voltage controlled oscillator 1200 of FIG. 12 for a range of input voltages. As shown in FIG. 13A, as the applied voltage to the oscillator increases, the resonant frequency of the oscillator also increases. Furthermore, as the applied voltage increases, the loss characteristics improve and the quality factor of the voltage controlled oscillator also increases. This is further demonstrated in the graph of FIG. 13B, which plots the unloaded quality factor (Q) for the oscillator over a range of input voltages. Notably, the Q of the oscillator is about 110 at 5V, about 160 at 10V, about 200 at 15V, and about 210 at 20V.

FIGS. 14A-14C are photographs of some of the resonant circuits and devices described above. Specifically, FIG. 14A is a photograph of an array of printed resonant circuits having a structure similar to that of FIG. 1A. FIG. 14B is a photograph of an array of printed resonant circuits having a structure similar to that of FIG. 1B. And FIG. 14C is a photograph of a VCO having a structure similar to that of FIG. 12.

The above example metamaterial resonators, möbius-metamaterial resonators and the substrate integrated waveguide-metamaterial resonators are shown in microwave oscillator applications. Notably, these resonators and combinations thereof may also be used in applications such as metamaterial antennas, absorbers, superlenses etc. Möbius strips can also be used as a resistor or capacitor. These may also be used in graphene möbius strips which provide some very useful peculiar electrical properties not found easily in nature. Möbius transformations similar to Laplace or Fourier transforms can be used in communications. The development of rotary travelling waves or standing wave oscillators also utilizes möbius strips.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A device comprising:
  a tunable oscillating circuit adapted to output an electric signal across a range of frequencies, the oscillating circuit comprising a tuning circuit capable of tuning the oscillator to a given frequency within the range of frequencies based at least in part on one of an input provided to the device and inherent noise or a nonlinearity in an active part of the oscillating circuit; and
  a metamaterial resonator operatively coupled to the tunable oscillating circuit, the metamaterial resonator adapted to increase the quality factor of the device over the range of tunable frequencies.

2. The device of claim 1, wherein the metamaterial resonator is implemented as a complementary circuit on a substrate or circuit board.

3. The device of claim 1, wherein the metamaterial resonator comprises:
  first and second concentric split ring elements forming a substantially planar split ring resonator, each concentric split ring element being substantially annular with a break extending radially from a center of the split ring resonator through the annulus, the break of the first split ring element extending in the opposite direction as the break of the second split ring element; and
  first and second ports coupled to the split ring elements.

4. The device of claim 3, wherein the first and second ports are coplanar with and edge-coupled to the first split ring element.

5. The device of claim 3, wherein each of the first and second ports is broadside coupled to the metamaterial resonator, the first port being located along a first plane parallel to the first and second split ring elements, the second port being located along a second plane parallel to the first and second split ring elements, the first and second planes extending, in opposing directions, transversely away from the plane of the split ring elements.

6. The device of claim 3, wherein both the first and second split ring elements are the same shape, said shape being selected from the group of a circle, square, oval and rectangle.

7. The device of claim 1, wherein the metamaterial resonator comprises:
  a first pair of concentric split ring elements forming a substantially planar split ring resonator, each concentric split ring element including a break extending radially outward from a point within the split ring resonator, the break of the first split ring element extending in the opposite direction as the break of the second split ring element;
  a second pair of concentric split ring elements having line symmetry with the first pair of concentric split ring elements over an axis bisecting the resonator;
  a first port coupled to the first pair of split ring elements; and
  a second port coupled to the second pair of split ring elements.

8. The device of claim 1, wherein the metamaterial resonator comprises:
  a first pair of concentric split ring elements forming a substantially planar split ring resonator, each concentric split ring element being substantially annular with a break extending radially outward from a point within the split ring resonator;
  a second pair of concentric split ring elements having line symmetry with the first pair of concentric split ring elements over an axis bisecting the resonator;
  a first connection line coupling the inner split ring elements of the first and second pair;
  a second connection line coupling the outer split ring elements of the first and second pair;
  a first port coupled to the first connection line; and
  a second port coupled to the second connection line.

9. The device of claim 8, further comprising a ground plane below each of the split ring elements, and an etch-out on the ground plane.

10. The device of claim 1, wherein the metamaterial resonator is adapted to have at least one resonant frequency of about 20 GHz or lower.

11. The device of claim 1, wherein phase noise of the oscillating circuit of the device is about −135 dBc/Hz or greater at an offset of 10 MHz.

12. The device of claim 1, wherein the metamaterial resonator is operatively coupled to the tuning circuit, and wherein the tuning circuit tunes the metamaterial resonator to a given frequency within the range of tunable frequencies based at least in part on the input provided to the device.

13. A resonant circuit comprising:
a möbius strip resonator having a topology in which a closed path formed by the möbius strip resonator, extends two or more revolutions around an axis before the closed path is completed; and
a metamaterial split ring resonator.

14. The resonant circuit of claim 13, wherein the metamaterial split ring resonator is implemented as a complementary circuit on a substrate or circuit board.

15. The resonant circuit of claim 13, wherein the möbius strip resonator comprises:
a substantially planar conductive strip arranged in a spiral, the conductive strip having an inner end and an outer end, and extending two or more revolutions around a centerpoint of the spiral;
a first via coupled to the first end;
a second via coupled to the second end; and
an electrically conductive connection between the first and second vias, thereby connecting the first and second ends of the conductive strip to form a möbius strip.

16. The resonant circuit of claim 13, wherein the möbius strip resonator comprises:
first and second substantially annular conductive element arranged on parallel first and second planes, respectively, each substantially annular conductive element having a first break defining first and second ends;
a first via extending transversely between the first and second plane and connecting the first end of the first substantially annular conductive element to the second end of the second substantially annular conductive element; and
a second via extending transversely between the first and second plane and connecting the second end of the first substantially annular conductive element to the first end of the second substantially annular conductive element, thereby connecting the first and second substantially annular conductive elements to form a möbius strip.

17. The resonant circuit of claim 16, wherein the first substantially annular conductive element is edge-coupled to a first port at a location of the first break, and to a second port at a location 180 degrees circumferentially from the first break.

18. The resonant circuit of claim 16, wherein the first substantially annular conductive element is broadside-coupled to a first port at a location 90 degrees circumferentially from the first break, and to a second port at a location −90 degrees circumferentially from the first break.

19. The resonant circuit of claim 16, wherein each of the first and second substantially annular conductive elements includes a second break, each second break extending radially outward from a center point of the substantially annular conductive element and located approximately 90 degrees apart, around the circumference of the substantially annular conductive element, from the first break, wherein the respective second breaks of the first and second substantially annular conductive elements extend from their respective center points in opposite directions.

20. The resonant circuit of claim 19, wherein the first substantially annular conductive element is broadside-coupled to a first port at the location of the second break, and to a second port at a location 180 circumferentially from the first break and 90 degrees circumferentially from the second break.

21. The resonant circuit of claim 13, wherein the resonant circuit is adapted to have at least one resonant frequency of about 8 GHz or lower.

22. A device comprising:
an oscillator circuit adapted to output an electric signal at a given frequency, the given frequency based at least in part on one of an input provided to the device and inherent noise or a nonlinearity in an active part of the oscillator circuit; and
the resonant circuit of claim 13.

23. The device of claim 22, further comprising one or more annular resonant elements at least partially overlaying the resonant circuit and adapted to suppress higher order modes generated by the device.

24. The device of claim 22, wherein phase noise of the oscillator circuit of the device is about −175 dBc/Hz or greater at an offset of 10 MHz.

25. A resonant circuit comprising:
a substrate integrated waveguide including:
a first planar metal layer;
a second planar metal layer parallel to the first layer; and
a plurality of plated vias extending transversely between the first and second planar metal layers, and connecting the first and second planar metal layers to one another;
a first port; and
a metamaterial resonator operatively coupled to the substrate integrated waveguide and the first port,
wherein the metamaterial resonator further comprises a substantially circular ring having first and second breaks on opposing sides of the ring along a first axis aligned with the first port, each of the breaks defining broken ends of the circular ring, each broken end of the ring extending in a common direction and in parallel with the first axis.

26. The resonant circuit of claim 25, wherein the metamaterial resonator comprises first and second concentric split ring elements forming a substantially planar split ring resonator, each concentric split ring element having a break extending radially from a center of the split ring resonator, the break of the first split ring element extending in the opposite direction as the break of the second split ring element, and wherein the split ring elements are coupled to first and second ports.

27. The resonant circuit of claim 26, wherein the first and second concentric form a substantially planar complementary split ring resonator.

28. The resonant circuit of claim 25, wherein the resonant circuit further comprises a second port opposite the first port, the first and second breaks of the metamaterial resonator being aligned with the first and second ports along the first axis of the resonant circuit.

29. The resonant circuit of claim 25, wherein each broken end of the ring extends in the direction towards the first port.

30. The resonant circuit of claim 25, wherein the resonant circuit is adapted to have at least one resonant frequency of about 25 GHz or lower.

31. A device comprising:
an oscillator circuit adapted to output an electric signal at a given frequency, the given frequency based at least in part on one of an input provided to the device and inherent noise or a nonlinearity in an active part of the oscillator circuit; and
the resonant circuit of claim 25.

32. The device of claim 31, wherein the device comprises one or more varactor diodes coupled to the metamaterial resonator of the resonant circuit.

33. The resonant circuit of claim 31, wherein phase noise of the oscillator circuit of the device is about e.g., 115.2 dBc/Hz or greater at a 1 MHz offset.

* * * * *